United States Patent
Nakamura et al.

(10) Patent No.: US 6,798,807 B2
(45) Date of Patent: Sep. 28, 2004

(54) SEMICONDUCTOR LASER AND SEMICONDUCTOR LASER MODULE

(75) Inventors: Atsushi Nakamura, Komoro (JP); Kiyomi Ikemoto, Tateshina (JP); Shoichi Takahashi, Saku (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/331,636

(22) Filed: Dec. 31, 2002

(65) Prior Publication Data

US 2003/0169796 A1 Sep. 11, 2003

(30) Foreign Application Priority Data

Mar. 8, 2002 (JP) ........................................ 2002-063580

(51) Int. Cl.⁷ ................................................ H01S 5/00
(52) U.S. Cl. .......................... 372/43; 372/45; 372/46; 372/47
(58) Field of Search ............................. 372/43, 45, 46

(56) References Cited

U.S. PATENT DOCUMENTS

| | | | | |
|---|---|---|---|---|
| 5,822,349 A | * | 10/1998 | Takaoka et al. | ............... 372/46 |
| 5,851,849 A | * | 12/1998 | Comizzoli et al. | ............ 438/38 |
| 6,469,785 B1 | * | 10/2002 | Duveneck et al. | .......... 356/244 |
| 2002/0121863 A1 | * | 9/2002 | Morishita | ................ 315/169.3 |

FOREIGN PATENT DOCUMENTS

JP         7-135369        5/1995

OTHER PUBLICATIONS

T. Odagawa, "10–Gb/s MI–DFB Laser for DWDM", *Electronic Materials*, Nov. 2001, pp. 31–33, with English translation attached.

* cited by examiner

*Primary Examiner*—Don Wong
*Assistant Examiner*—Dung T Nguyen
(74) *Attorney, Agent, or Firm*—Miles & Stockbridge P.C.

(57) ABSTRACT

A semiconductor laser performs high-speed modulation with a low-capacitance structure. The laser comprises a multilayered growth layer which is electrically isolated from a substrate and includes an active layer between a lower semiconductor layer of first conductivity type and an upper semiconductor layer of second conductivity type. A ridge is formed on the surface of the multilayer without reaching the active layer, and an insulating film is formed on the substrate main surface except for the ridge upper surface. An electrode contacts the second conductivity type semiconductor layer on the ridge upper surface and extends onto the insulating film beyond a second isolation trench, and an electrode which deviates from above the ridge is formed on the insulating film on a first isolation trench side and contacts the first conductivity type semiconductor layer located below the active layer.

17 Claims, 17 Drawing Sheets

SEMICONDUCTOR LASER AND SEMICONDUCTOR LASER MODULE

BACKGROUND OF THE INVENTION

The present invention relates to a technology for manufacturing a semiconductor laser and a technology for manufacturing a semiconductor laser module with the semiconductor laser built therein, and to, for example, a technology effective for application to a technology for manufacturing a semiconductor laser for optical communications.

In a wavelength division multiplexing (WDM) type optical transmission system, a demand for more speeding-up has been made even to transmission equipment with an increase in the amount (traffic) of data to be transmitted. A DFB (Distributed FeedBack) laser with a modulator for 10 Gbps DWDM (Dense Wavelength Division Multiplexing) built therein has been described in, for example, the November 2001 issue "Electronic Materials" by Institute for Industrial Research, P31–P33. A direct modulation DFB-LD (Laser Diode) or the like has been also described in the present reference.

Unexamined Patent Publication No. Hei 7(1995)-135369 has disclosed, as a semiconductor laser used as a light source for optical communications, a semiconductor laser wherein first and second electrodes are disposed on the same surface so as to allow flip-chip packaging, and a stray capacitance of a device is reduced to thereby enable handling of a high-speed operation. The same reference describes that a cutoff frequency f of a semiconductor laser (semiconductor laser device) becomes f=½πRC and a reduction in the capacitance C of the device allows high-speed modulation from this equation. The reference also describes that the capacity of a normal semiconductor laser in which two electrodes are opposed with a substrate and respective layers interposed therebetween, is one by adding a junction capacitance Cj formed between an active layer and a clad layer and a stray capacitance Cd developed between the electrodes.

The present reference has described that the semiconductor laser disclosed therein is formed on a semi-insulating substrate, and a minus electrode 12 and a plus electrode 20 are disposed so as to be electrically isolated from each other on the same surface, whereby the stray capacitance developed between the electrodes is greatly reduced.

SUMMARY OF THE INVENTION

In the case of a semiconductor laser having an embedded layer on the main surface side of a semiconductor substrate, the end-point management of embedded growth is difficult and the surface of the semiconductor substrate and the surface of the embedded layer are hard to be identical to each other. A buildup of a boundary face also occurs on the embedded-layer side. As a result, it is difficult to connect both a first electrode provided on the surface of the semiconductor substrate and a second electrode provided on the surface of the embedded layer to their corresponding electrode portions of a printed circuit board in a satisfactory state through the use of bonding materials under a so-called junction down state in which the side of a pn junction is set as a mounting surface. Yield degradation and deterioration in packaging reliability are produced.

Therefore, the present inventors have discussed that in a ridge structure in which the surface of the semiconductor laser is made flat, the first and second electrodes are disposed on the surface of the semiconductor laser to carry out flip-chip packaging. Namely, while trenches or grooves exist on both sides of a ridge (stripe) to form the ridge in the ridge structure, the outer surface of each trench is identical in height to the surface of the ridge.

FIGS. 31 through 33 are respectively diagrams related to a semiconductor laser (semiconductor laser device) for high-speed optical communications, which has been discussed prior to the present invention, wherein FIG. 31 is a typical perspective view of the semiconductor laser, FIG. 32 is an enlarged view of a ridge waveguide portion, and FIG. 33 is an equivalent circuit diagram of the semiconductor laser, respectively.

The semiconductor laser 60 has a structure wherein it has a multilayered semiconductor layer including an active layer on a main surface of a semiconductor substrate 61, and an anode electrode 75 and a cathode electrode 76 are respectively provided on the surface thereof and the back surface thereof.

The semiconductor substrate 61 serves as an n-InP substrate 61, for example. A lower SCH (Separate Confinement Heterostructure) layer 62 formed of an n-InGaAlAs layer, an active layer 63 made up of an InGaAlAs layer, an upper SCH layer 64 made up of a p-InGaAlAs layer, a p-InP layer 65 and a p-InGaAs layer 66 are sequentially laminated and formed on the n-InP substrate 61.

The multilayered crystal layer is provided with two grooves or trenches 67 in parallel on its surface. A ridge (stripe) 68 is formed at a portion interposed between the two trenches 67. The trenches 67 are defined by removing, by etching, the p-InGaAs layer 66 corresponding to the top layer of the multilayered crystal layer and the p-InP layer 65 provided therebelow. The upper SCH layer 64 is exposed at the bottom of each trench 67. The ridge 68 has a width of 2 μm and a length of 200 μm.

An insulating film 69 formed of an $SiO_2$ film is provided so as to extend beyond the trenches 67 from both sides of the ridge 68 respectively and extend over the p-InGaAs layers 66 located outside the trenches 67. Namely, only the upper surface of the ridge 68 is exposed without being covered with the insulating film 69. An anode electrode (p electrode) 75, which electrically contacts the p-InGaAs layer 66 for forming the upper surface of the ridge 68, is provided up to an area extending from the ridge 68 to outer edge portions of the trenches 67 on both sides of the ridge 68. The anode electrode 75 is formed with wire bonding portions 75a which extend out so as to become wide on the center side of the ridge 68 and are connectable with wires (see FIG. 31). A cathode electrode (n electrode) 76 is provided on the back surface of the n-In substrate 61.

Incidentally, the active layer 63 takes a multiple quantum well (MQW) structure. Diffraction gratings are provided on the surface of the n-InP substrate 61 along the longitudinal direction of the ridge 68 to thereby configure a distributed feedback semiconductor layer (DFB-LD).

When a predetermined voltage is applied between the anode electrode 75 and the cathode electrode 76 in such a semiconductor laser 60, laser light is emitted from the end of the active layer 63 corresponding to the ridge 68.

A reduction in capacitance is essential for a high-speed modulation laser diode (semiconductor laser). As means for achieving the capacitance reduction, there is (1) a method of reducing electrode areas or (2) a method of making thick a dielectric material between electrodes under a structure wherein the electrodes are opposed to each other with an active layer interposed therebetween. When the anode electrode 75 is further reduced to make each electrode smaller in the semiconductor laser 60 shown in FIG. 31, the wire bonding portions 75a must be further reduced, so that a problem arises in that the wire connecting portions partly extend out from the wire bonding portions 75a, for example, and the reliability (bonding property) of wire connectivity is degraded. This is not preferable. FIG. 17(c) shows a dimensional example of the wire bonding portion 75a employed in the semiconductor laser 60. Since a light-emitting property is impaired, each wire is not bonded onto a ridge portion, i.e., an optical waveguide (resonator) but bonds a position distant from it, i.e., the wire bonding portion 75a. Even where the area of the wire bonding portion 75a is reduced for the purpose of the capacity reduction, the wire bonding portion 75a needs a quadrangular area whose one side is about 80 $\mu$m in the case of a wire having a diameter of about 25 $\mu$m.

Even in the junction down state in which the semiconductor laser 60 is mounted with being turned upside down, a reduction in the area of each wire bonding portion 75a will degrade the reliability of connection of the semiconductor laser 60 by the bonding materials. The method (2) of making thick the dielectric material between the electrodes is difficult even on a process basis.

FIG. 33(a) is an equivalent circuit diagram of the semiconductor laser 60 as shown even in the enlarged view of FIG. 32. A capacitor C1 and a capacitor C2 exist in parallel with the laser diode LD between the p electrode and the n electrode. The capacitor C1 is a capacitance between the p electrode which interposes the insulating film 69 therein and the upper SCH layer 64, and the capacitor C2 is a capacitance (junction capacitance) of the active layer 63. The resistor R1 is a resistance between the p electrode and the active layer 63, and the resistor R2 is a resistance of the upper SCH 64 (as viewed in the transverse direction). When the resistor R2 is considerably larger than the resistor R1 and the capacitor C2 is greatly larger than the capacitor C1, the equivalent circuit diagram can be represented by the resistor R1 connected in series with the laser diode LD and the capacitor C1 connected in parallel with the laser diode LD as shown in FIG. 33(b).

It is understood that the semiconductor laser 60 shown in FIG. 31 is large in the capacitor C1 and is not suitable as a light source for high-speed optical communications.

An object of the present invention is to provide a low-capacity (i.e., low capacitance) semiconductor laser.

Another object of the present invention is to provide a semiconductor laser having an anode electrode and a cathode electrode on the same surface side and low in capacity.

A further object of the present invention is to provide a low-capacity semiconductor laser having an anode electrode and a cathode electrode on the same surface side and wide in electrode area.

A yet another object of the present invention is to provide a low-capacity semiconductor laser module.

A still further object of the present invention is to provide a semiconductor laser module high in the reliability of packaging of a semiconductor laser and low in capacity.

The above of the present invention, and other objects and novel features thereof will become apparent from the description of the present specification and the accompanying drawings.

Summaries of typical ones of the inventions disclosed in the present application will be described in brief as follows:

(1) A semiconductor laser comprises a semiconductor substrate, a multilayered growth layer which is formed on the main surface side of the semiconductor substrate in multilayer form and which is electrically isolated from the semiconductor substrate and includes, in a middle layer, an active layer interposed between a semiconductor layer of first conductivity type corresponding to a lower layer and a semiconductor layer of second conductivity type corresponding to an upper layer, a ridge formed between two trenches, which is provided on the surface of the multilayered crystal layer without reaching the active layer, a first isolation trench which is provided outside the trench located on one side of the ridge along the ridge and reaches a semiconductor layer below the active layer, a second isolation trench which is provided outside the trench located on the other one side of the ridge and reaches a surface layer of the semiconductor substrate through the multilayered growth layer, an insulating film which covers the respective surfaces of the trenches, the first isolation trench, the second isolation trench, the multilayered growth layer between the first isolation trench and the second isolation trench, the multilayered growth layer outside the first isolation trench, and the multilayered growth layer outside the second isolation trench, except for the upper surface of the ridge, a second electrode whose part is provided on the semiconductor layer of second conductivity type on the upper surface of the ridge and which is provided on the insulating film located on the multilayered growth layer outside the second isolation trench beyond the second isolation trench as viewed from the upper surface of the ridge, and a second electrode which deviates from above the ridge and is formed on the insulating film on the first isolation trench side and whose part contacts the first conductivity type semiconductor layer located below the active layer.

The semiconductor layer corresponding to the lowest or bottom layer of the multilayered growth layer is Fe-implanted so as to electrically isolate the semiconductor layer above such a semiconductor layer from the semiconductor substrate, thereby resulting in electrically high resistance. The first electrode comprises a flat portion formed on the insulating film located on the multilayered growth layer outside the first isolation trench, and a contact portion which extends in connection with the flat portion and is provided in the flat portion area so as to reach the layer located below the active layer. The length of the active layer extending between the first isolation trench and the second isolation trench is approximately 40 $\mu$m.

A semiconductor laser module with such a semiconductor laser built therein comprises a package having a plurality of external electrode terminals, a support substrate encapsulated in the package, a semiconductor laser fixed onto the support substrate and encapsulated in the package, connecting means which electrically connect respective electrodes of the semiconductor laser and the external electrode terminals within the package, and an optical fiber which extends over the inside and outside a case for the package and has an inner end that faces an outgoing surface of the semiconductor laser so as to take in laser light emitted from the semiconductor laser. The support substrate is formed with predetermined wiring patterns on an upper surface thereof. The semiconductor laser is flip-chip packaged to the support substrate in the junction down state. The package comprises a box-shaped package body formed of an insulating resin, and a cap for blocking the package body. The external electrode terminals extend over the inside and outside the package body, and the support substrate is fixed onto some of the external electrode terminals, and wires of the support substrate and inner end portions of the external electrode terminals are connected by conductive wires.

In the semiconductor laser as described above, a portion at which the capacitance is formed, corresponds to a portion that faces a narrow area between a first isolation trench and a second isolation trench. It does not depend on the areas of first and second electrodes provided on a main surface of the semiconductor laser. It is therefore possible to provide a semiconductor laser and a semiconductor laser module, which are capable of achieving a reduction in capacity and performing high-speed modulation.

DETAILED DESCRIPTION OF THE PREFERRED EMBODIMENTS

Figure 1:
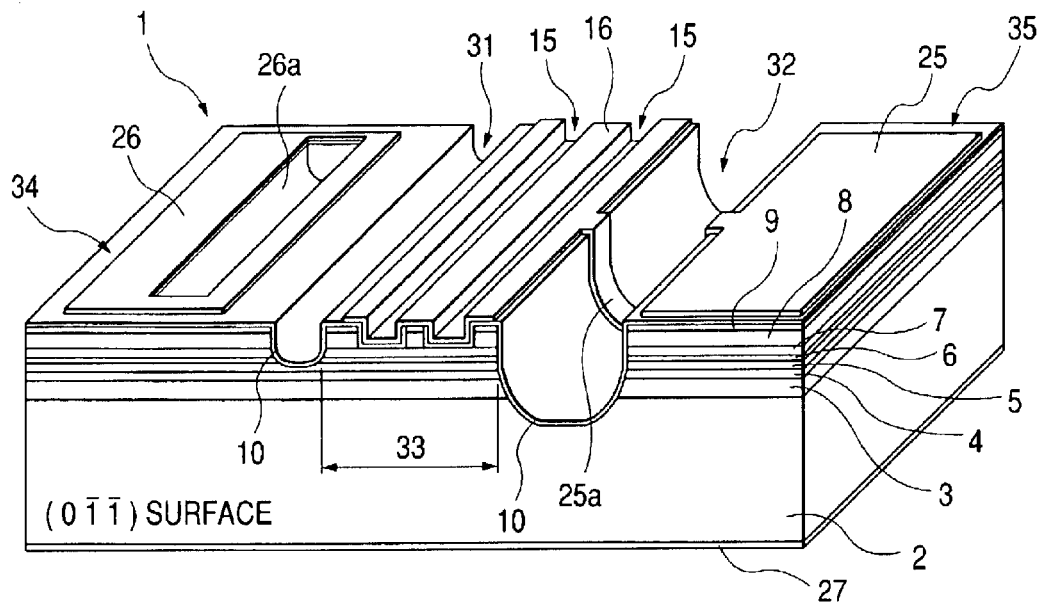
FIG. 1 is a typical perspective view of a semiconductor laser showing one embodiment (first embodiment) of the present invention.

Preferred embodiments of the present invention will hereinafter be described in detail with reference to the accompanying drawings. Incidentally, components each having the same function in all drawings for describing the embodiments of the present invention are respectively identified by the same reference numerals and their repetitive description will be omitted.

(First Embodiment)

FIGS. 1 through 25 are diagrams related to a semiconductor laser showing one embodiment (first embodiment) of the present invention. FIGS. 1 through 4 are diagrams related to the semiconductor laser, FIGS. 5 through 16 are diagrams related to a method of manufacturing the semiconductor laser, and FIGS. 18 through 25 are diagrams related to a semiconductor laser module, respectively.

Figure 2:
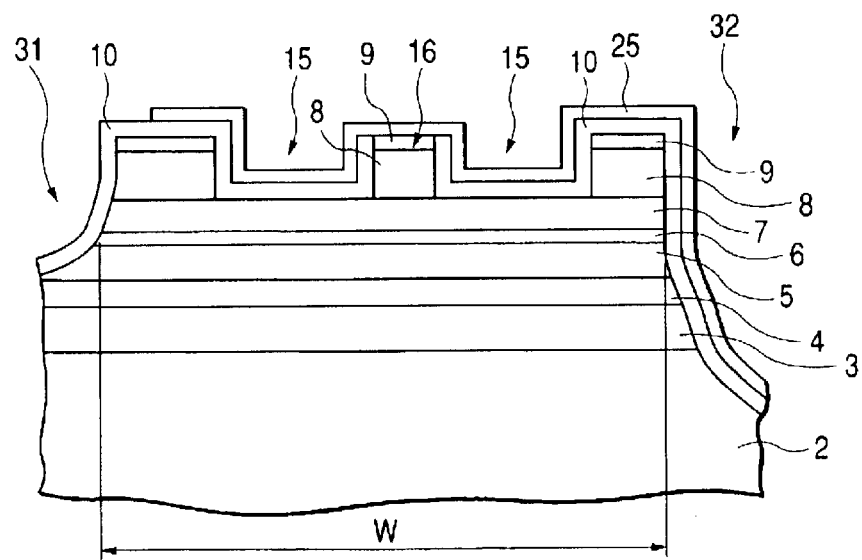
FIG. 2 is an enlarged cross-sectional view illustrating between isolation trenches of the semiconductor laser of the first embodiment.
Figure 3:
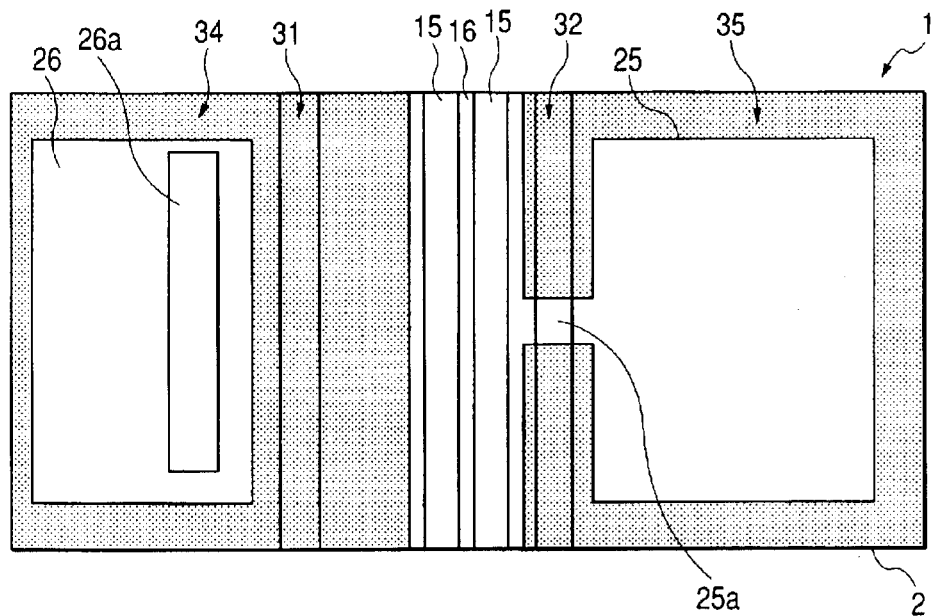
FIG. 3 is a typical plan view depicting the relationship of position between the isolation trenches and electrodes employed in the semiconductor laser of the first embodiment.

As shown in FIGS. 1 through 3, the semiconductor laser 1 according to the first embodiment has a multilayered semiconductor layer including an active layer on a main surface of a semiconductor substrate 2, and is provided with an anode electrode (p electrode) 25 and a cathode electrode (n electrode) respectively provided as a second electrode and a first electrode on its upper surface (main surface), and a metallized layer 27 provided on its back surface. Part of the multilayered semiconductor layer including the active layer constitutes a light-emitting unit (first area), the p electrode constitutes a second area, and the n electrode constitutes a third area, respectively.

Respective flat portions of the anode electrode 25 and the cathode electrode 26 are provided on the same plane. The metallized layer 27 is a metal layer satisfactory in wet characteristic with respect to a bonding material used upon fixing the semiconductor laser 1 to a printed circuit board or the like. Although not illustrated in the drawing, one surface, i.e., forward outgoing surface of the semiconductor laser 1 is formed with a reflective film whose reflectivity becomes less than or equal to 1%, whereas a backward outgoing surface thereof is formed with a reflective film whose reflectivity is 90% or more. A crystal plane on a frontward outgoing surface of the semiconductor laser 1 is represented as a (0, bar 1, bar 1) plane.

As shown in FIGS. 1 and 2, the semiconductor substrate 2 serves as, for example, an n-InP substrate 2. A multilayered growth layer is formed on the semiconductor substrate 2. Namely, an Fe—InP layer (high-resistance layer) 3 doped with iron (Fe), an n-InP layer (first semiconductor layer) 4, a lower SCH layer (fourth semiconductor layer) 5 made up of an n-InGaAlAs layer, an active layer 6 formed of an InGaAlAs layer, an upper SCH layer (fifth semiconductor layer) 7 made up of a p-InGaAlAs layer, a p-InP layer (second semiconductor layer) 8, and a p-InGaAs layer (third semiconductor layer) 9 are sequentially laminated and formed on the main surface of the semiconductor substrate 2. The Fe—InP layer 3 becomes a high-resistance layer and electrically isolates the multilayered growth layer provided thereon and the semiconductor substrate 2. The active layer 6 serves as a multiple quantum well (MQW) structure in which an InGaAlAs layer is formed as a well layer and an InGaAlAs layer different from the well layer in composition is formed as a barrier layer. For example, the well layer becomes 6 nm in thickness and the barrier layer becomes 10 nm in thickness. The InGaAlAs layer results in 5 to 10 layers. The active layer has a part which constitutes a resonator (optical waveguide) that performs laser oscillations. The main surface of the semiconductor substrate 2 is flat, and the surface of the multilayered growth layer formed on its flat surface, i.e., the surface of the p-InGaAs layer 9 results in a flat surface.

The multilayered growth layer is provided with two trenches 15 in parallel with its surface. A ridge (stripe) 16 is formed by a protruded portion interposed between the two trenches 15. The trenches 15 are defined by removing, by etching, the p-InGaAs layer 9 corresponding to the top layer of the multilayered crystal layer and the p-InP layer 8 provided therebelow. The upper SCH layer 7 is exposed at the bottom of each trench 15. The ridge 16 has a width of 2 $\mu$m and a length of 200 $\mu$m, for example. The semiconductor laser 1 has a width of 400 $\mu$m, a length of 200 $\mu$m and a thickness of 100 $\mu$m, for example. Although not shown in the drawing, diffraction gratings are provided over the main surface of the semiconductor substrate 2 along the ridge 16. The semiconductor laser 1 serves as a negative feedback semiconductor laser.

As shown in FIGS. 1 through 3, a first isolation trench 31 is provided on one side of a part including the ridge 16 and the trenches 15 on both sides thereof, whereas a second isolation trench 32 is formed on the other one side. The first isolation trench 31 is provided on the left side (one side) of a portion (hereinafter called "area 33 between the isolation trenches") including the ridge 16 and the trenches 15 on both sides thereof, and a flat portion lying between the trench 15 and its corresponding isolation trench, whereas the second isolation trench 32 is provided on the right side (other one side).

A surface portion extending from the outside of the first isolation trench 31 to the left end of the semiconductor laser 1 serves as a flat surface 34, and a surface portion extending from the outside of the second isolation trench 32 to the right end of the semiconductor laser 1 serves as a flat surface 35. An insulating film 10 is provided so as to range from other one side of the ridge 16 to the flat surface 35. The insulating film 10 covers the surface of the ridge 16, i.e., the surface (main surface) of the semiconductor laser 1 other than the surface of the p-InGaAs layer 9. The insulating film 10 is formed of, for example, an $SiO_2$ film.

The anode electrode (p electrode) 25, which electrically contacts the p-InGaAs layer 9 for forming the upper layer of the ridge 16, is formed from the flat surface 35 to the neighborhood of the first isolation trench 31 beyond the second isolation trench 32, the trench 15, the ridge 16 and the trench 15. The anode electrode 25 is provided so as to join into one by a thin electrode portion 25a at part of the second isolation trench 32. The cathode electrode 26 is formed on the flat surface 34. The cathode electrode 26 is provided even on the surface of a contact hole 26c provided at part of the flat surface 34. Since the contact hole 26c is provided so as to reach the lower SCH layer 5 provided below the active layer 6, the cathode electrode 26 is electrically connected to the lower SCH layer 5 through a contact portion 26a formed so as to cover the surface of the contact hole 36. Since the anode electrode 25 and the cathode electrode 26 are formed on the insulating film 10 formed on the surface of the flat p-InGaAs layer 9, the anode electrode 25 and the cathode electrode 26 are held in a relationship in which they are positioned on the same plane.

The first isolation trench 31 and the second isolation trench 32 are defined in the main surface of the semiconductor laser 1 by etching over the whole region in its depth direction (lengthwise direction). The first isolation trench 31 is provided from the p-InGaAs layer 9 corresponding to the top layer of the multilayered growth layer to a depth lying in the course of the lower SCH layer 5 beyond the active layer 6. The second isolation trench 32 is provided from the p-InGaAs layer 9 corresponding to the top layer to a depth lying in the course of the semiconductor substrate 2 beyond the active layer 6 an the Fe—InP layer 3.

As shown in FIG. 2, the width W of the active layer 6 in the area 33 ranges from about 30 $\mu$m to about 40 $\mu$m, for example owing to the existence of the first isolation trench 31 and the second isolation trench 32. Namely, to take a single example, the width of the ridge 16 is 2 μm and the widths of the trenches 15 on both sides thereof are 10 μm. With the shortening of the width W of the active layer 6, a reduction in the capacitance due to a pn junction thereof can be achieved and a stray capacitance between the portions with the insulating film interposed therebetween can be reduced.

The cathode electrode 26 formed on the flat surface 34 and the anode electrode 25 formed on the flat surface 35 serve as wire boding portions for connecting wires, when the semiconductor laser 1 is mounted on the substrate in a junction up state, whereas the cathode electrode 26 and the anode electrode 25 serve as bonding portions connected with bonding materials when the semiconductor laser 1 is mounted on the substrate in a junction down state with the bonding materials interposed therebetween.

When a predetermined voltage is applied between the anode electrode 25 and the cathode electrode 26, such a semiconductor laser 1 emits laser light from the end of the active layer 6 corresponding to the ridge 16.

Figure 4A:
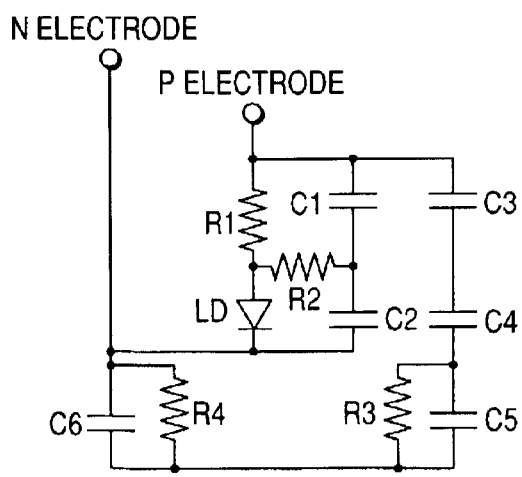
FIGS. 4(a) and 4(b) are equivalent circuit diagrams of the semiconductor laser of the first embodiment.

FIG. 4(a) is an equivalent circuit diagram of the semiconductor laser 1. In the equivalent circuit, R1 indicates a resistor provided between the p electrode and the active layer, R2 indicates a resistor of the upper SCH layer 7 (lateral direction), C1 indicates a capacitor (only W between the first isolation trench 31 and the second isolation trench 32) provided between the p electrode and the cathode electrode 26 interposing the insulating film ($SiO_2$ film) therebetween, C2 indicates a capacitor (where it corresponds to the W portion between the first isolation trench 31 and the second isolation trench 32) of the pn junction of the active layer 6, R3 indicates a resistor (right portion of the second isolation trench 32) of the Fe—InP layer 3 provided between the n-InP layer 4 and the n-InP substrate 2 (semiconductor substrate 2), R4 indicates a resistor (left portion of the second isolation trench 32) of the Fe—InP layer 3 provided between the n-InP layer 4 and the n-InP substrate 2 (semiconductor substrate 2), C3 indicates a capacitor (portion except for W between the first isolation trench 31 and the second isolation trench 32) provided between the p electrode and the cathode electrode 26 interposing the insulating film 10 therebetween, C4 indicates a capacitor (portion except for W between the first isolation trench 31 and the second isolation trench 32) of the active layer, C5 indicates a capacitor (right portion of the second isolation trench 32) of the Fe—InP layer 3 provided between the n-InP layer 4 and the n-InP substrate 2 (semiconductor substrate 2), and C6 indicates a capacitor (left portion of the second isolation trench 32) of the Fe—InP layer 3 provided between the n-InP layer 4 and the n-InP substrate 2 (semiconductor substrate 2).

Figure 4B:
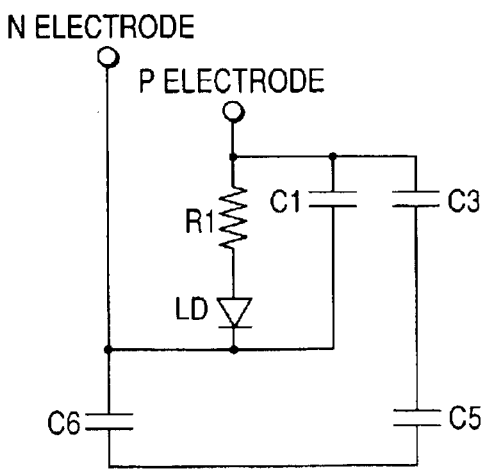

When the resistor R2 is greatly large as compared the resistor R1, and the capacitor C2 is greatly large as compared with the capacitor C1, R2 and C2 can be neglected. Since the resistivity of Fe-doped InP is $1 \times 10^{18}$ [Ω·cm] or more when a doping density of Fe is $2 \times 10^{18}$ cm$^{-3}$, FIG. 4(a) can be represented approximately as shown in FIG. 4(b) if the resistances of R3 and R4 are neglected. Since the capacitances of C5 and C6 become smaller than C3 if the thickness of Fe-doped InP is about 5 μm, the influence of C3 on a high-frequency characteristic is reduced.

Owing to the reduction in capacitance, the semiconductor laser 1 according to the first embodiment becomes satisfactory in high-frequency characteristic and results in a semiconductor laser suitable for high-speed communications.

A method of manufacturing the semiconductor laser 1 according to the first embodiment will next be described with reference to FIGS. 5 through 16. In the first embodiment, a description will be made of an example for manufacturing a semiconductor laser in which an oscillation wavelength used for forming an active layer of a multiple quantum well (MQW) structure on an InP substrate lies in a 1.3-μm band. The manufacture of the semiconductor laser 1 will be described in a manufacturing state of a single semiconductor device (semiconductor laser chip) for convenience of explanation.

Figure 5:
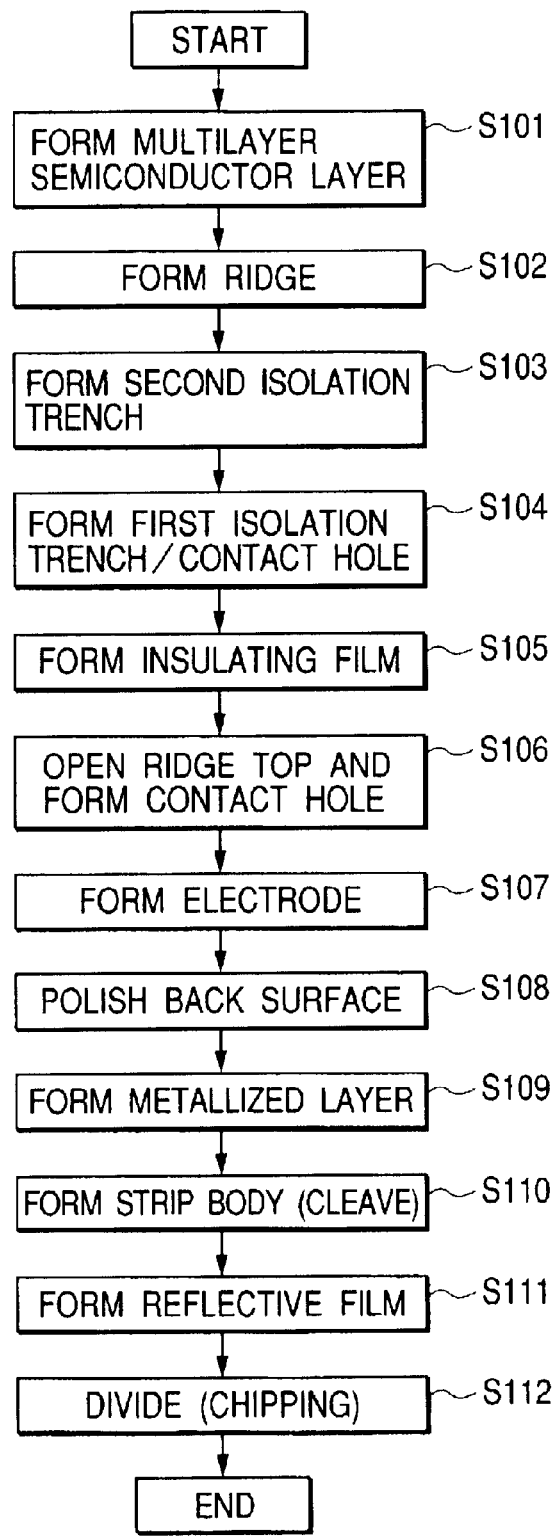
FIG. 5 is a flowchart showing a manufacturing process of the semiconductor laser of the first embodiment.

As shown in a flowchart of FIG. 5, the semiconductor laser 1 is manufactured through respective steps: a multi-layered semiconductor layer forming step (S101), a ridge forming step (S102), a second isolation trench forming step (S103), a first isolation trench/contact hole forming step (S104), an insulating film forming step (S105), a ridge-top opening/contact hole forming step (S106), an electrode forming step (S107), a back surface polishing step (S108), a metallized layer forming step (S109), a bar or strip body forming (cleavage) step (S110), a reflective film forming step (S111), and a dividing (chipping) step (S112).

Figure 6:
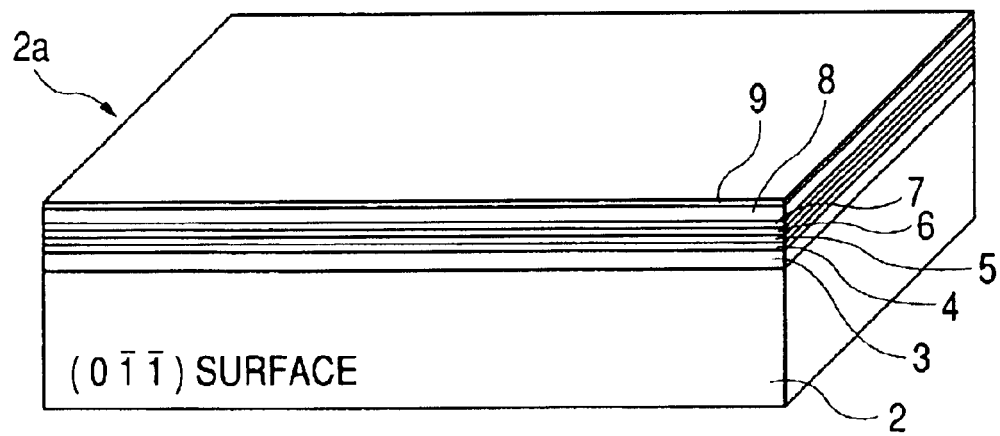
FIG. 6 is a perspective view of a semiconductor substrate formed with a multilayered growth layer on a main surface thereof upon manufacture of the semiconductor laser of the first embodiment.

A semiconductor substrate (wafer) 2a wide in area is first prepared. A multilayered semiconductor layer (multilayered growth layer) is formed on a main surface of the wafer 2a as shown in FIG. 6 (S101). As the wafer 2a, although not shown in the drawing, one is prepared wherein diffraction gratings for forming a distributed feedback type semiconductor laser on its main surface have been already formed selectively. Incidentally, FIG. 6 shows a portion for forming a single semiconductor laser. Even in subsequent descriptions, respective drawings correspond to drawings each showing the portion for forming part of the wafer 2a, i.e., the single semiconductor laser. On the other hand, portions for forming semiconductor lasers are lengthwise and crosswise formed in line on the main surface of the wafer 2a. The wafer 2a is divided into grating form in a final step to thereby fabricate a plurality of semiconductor lasers.

As shown in FIG. 6, the wafer 2a is made up of an n-type InP substrate. An Fe—InP layer 3, an n-InP layer 4, a lower SCH layer 5, an active layer 6, an upper SCH layer 7, a p-InP layer 8, and a p-InGaAs layer 9 are respectively formed on the surface (main surface and upper surface) thereof with predetermined thicknesses by, for example, a selective growth method based on a MOCVD (Metal Organic Chemical Vapor Deposition) method. The active layer 6 takes a multiple quantum well (MQW) structure. A well layer corresponds to an InGaAlAs layer and a barrier layer corresponds to an InGaAsP layer. The well layer has a thickness of 6 nm and the barrier layer has a thickness of 10 nm. The well layer results in 5 to 10 layers. The lower SCH layer 5 is made up of an n-InGaAlAs layer, and the upper SCH layer 7 is made up of a p-InGaAlAs layer.

Figure 7:
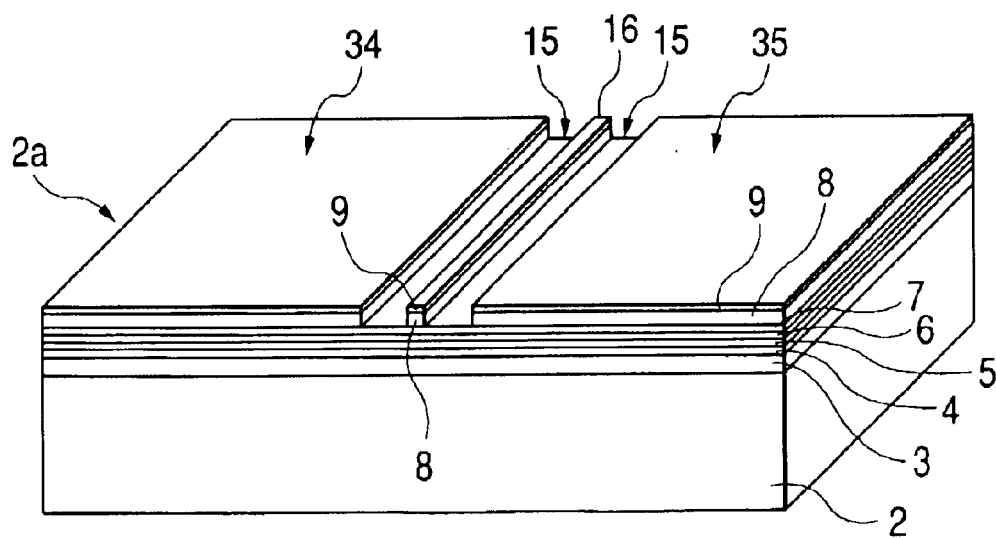
FIG. 7 is a perspective view of the semiconductor substrate with a ridge formed by removing part of the multilayer grown layer upon manufacture of the semiconductor laser of the first embodiment.

Next, as shown in FIG. 7, two trenches 15 are defined in the main surface of the wafer 2a in parallel by the normal photolithography technology and etching technology to thereby form a ridge 16 (S102). The width of each trench 15 is about 10 μm, for example. The ridge 16 is formed of a stripe-shaped semiconductor layer lying between the two trenches 15. Etching is performed so as to remove the p-InGaAs layer 9 corresponding to a top layer of the multilayered semiconductor layer and the p-InP layer 8 provided therebelow, so that the upper SCH layer 7 is exposed at the bottoms of the trenches 15 on both sides of the ridge 16. The width of the ridge 16 is about 2 μm, for example. A flat surface 34 extends outside the trench 15 located on the left side of the ridge 16, whereas a flat surface 35 extends outside the trench 15 located on the right side of the ridge 16.

Figure 8:
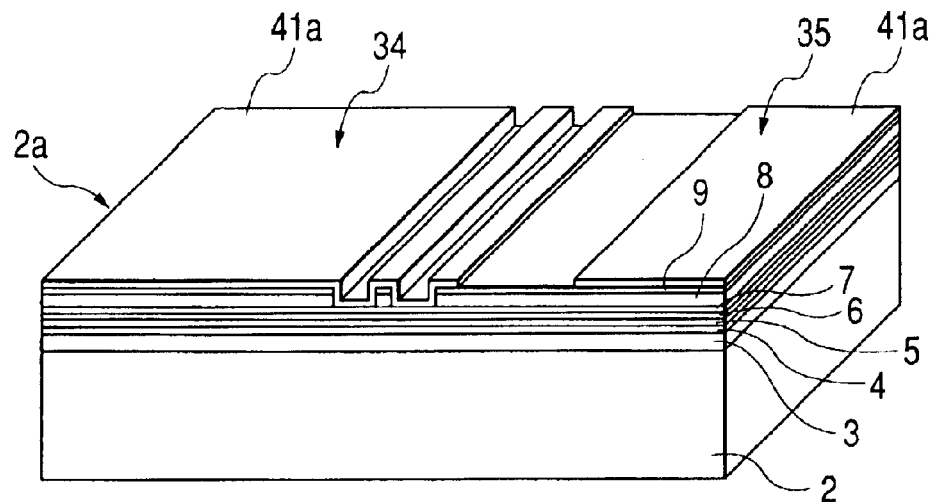
FIG. 8 is a perspective view of the semiconductor substrate formed with etching masks at a previous stage for forming a second isolation trench upon manufacture of the semiconductor laser of the first embodiment.
Figure 9:
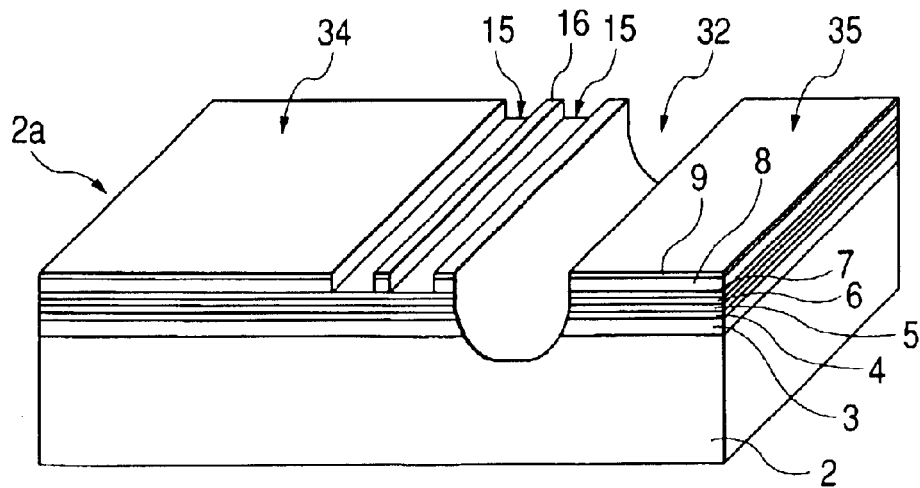
FIG. 9 is a perspective view of the semiconductor substrate formed with the second isolation trench upon manufacture of the semiconductor laser of the first embodiment.

Next, as shown in FIG. 8, a photoresist film 41a is formed except for a portion of the flat surface 35 near the ridge 16. Thereafter, the multilayered semiconductor layer is sequentially etched with the photoresist film 41a as an etching mask as shown in FIG. 9 to thereby define a second isolation trench 32 which reaches a depth (surface layer portion) lying in the course of the semiconductor substrate 2 (S103). After the formation of the second isolation trench 32, the photoresist film 41a is removed.

Figure 10:
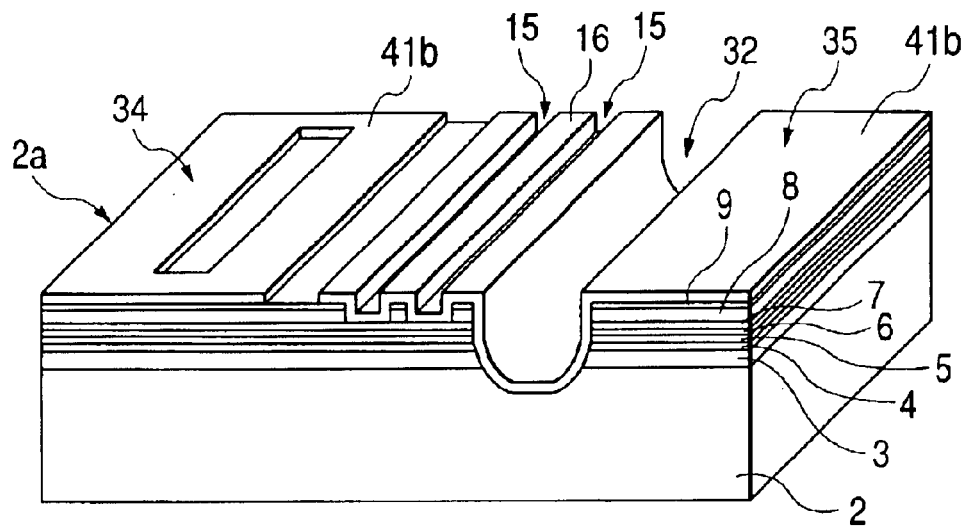
FIG. 10 is a perspective view of the semiconductor substrate formed with etching masks at a previous stage for forming a first isolation trench and a contact hole for an electrode upon manufacture of the semiconductor laser of the first embodiment.
Figure 11:
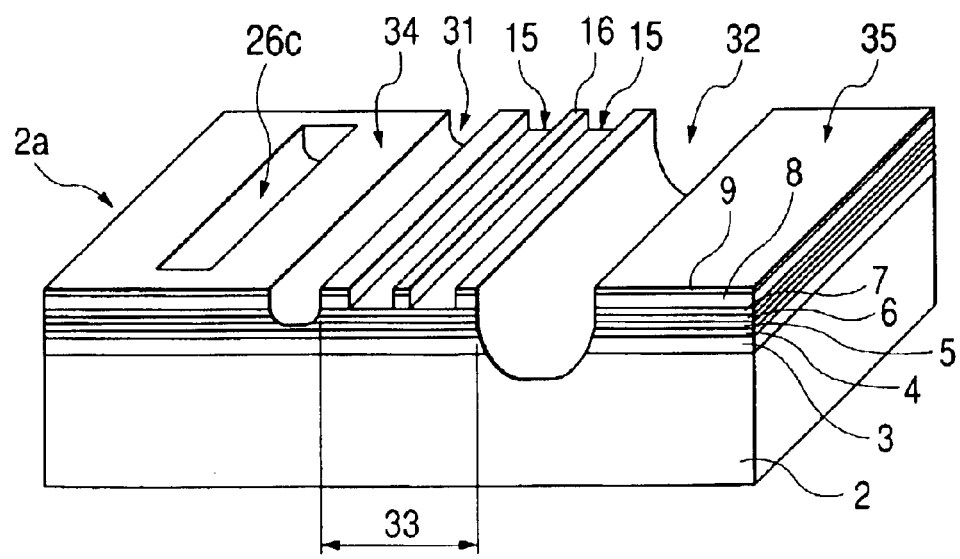
FIG. 11 is a perspective view of the semiconductor substrate formed with the first isolation trench and the contact hole for the electrode upon manufacture of the semiconductor laser of the first embodiment.

Next, as shown in FIG. 10, a photoresist film 41b is selectively formed on the main surface of the wafer 2a to form or define a first isolation trench 31 and a contact hole 26c. With the photoresist film 41b as an etching mask, the multilayered semiconductor layer is etched from the p-InGaAs layer 9 corresponding to the top layer to a depth lying in the course of the lower SCH layer 5 located below the active layer 6 beyond the active layer 6 to thereby form the first isolation trench 31 and the contact hole 26c as shown in FIG. 11 (S104). A isolation trench-to-isolation trench area 33 formed between these first isolation trench 31 and second isolation trench 32 is formed to a length which ranges from about 30 $\mu$m to about 40 $\mu$m.

Figure 12:
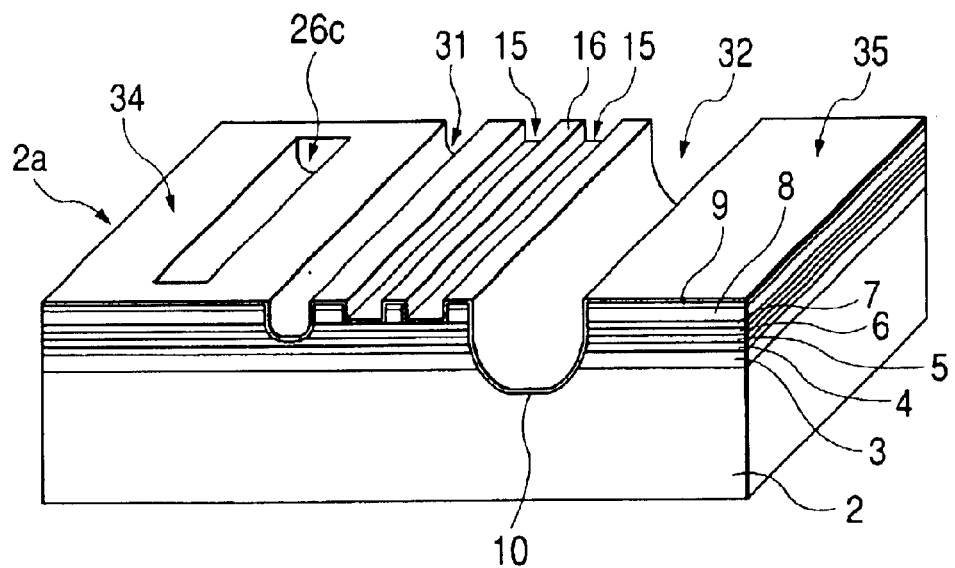
FIG. 12 is a perspective view of the semiconductor substrate formed with a passivation film over the whole surface area upon manufacture of the semiconductor laser of the first embodiment.

Next, as shown in FIG. 12, an insulating film 10 made up of an $SiO_2$ film is formed over the whole area of the main surface of the wafer 2a (S105).

Figure 13:
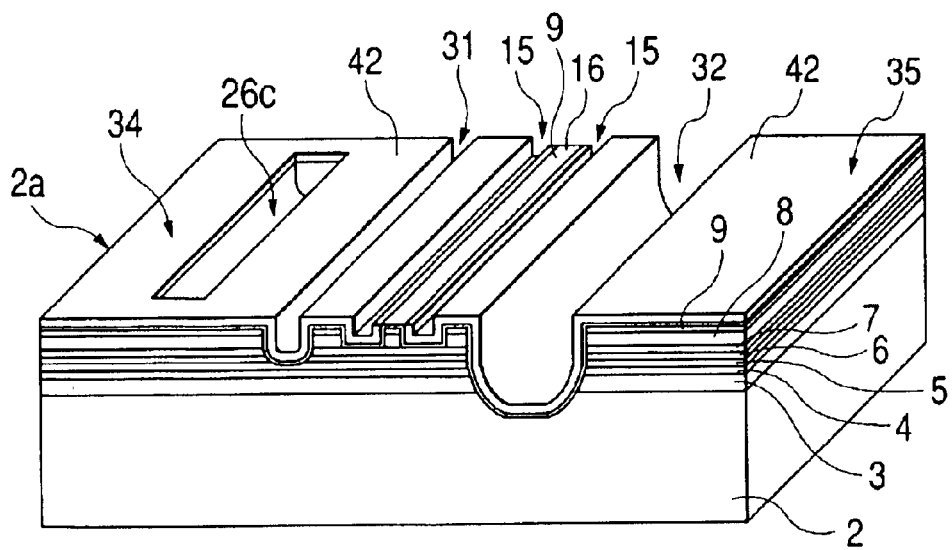
FIG. 13 is a perspective view of the semiconductor substrate formed with etching masks at a previous stage for forming the contact hole for the electrode and opening the top of the ridge upon manufacture of the semiconductor laser of the first embodiment.
Figure 14:
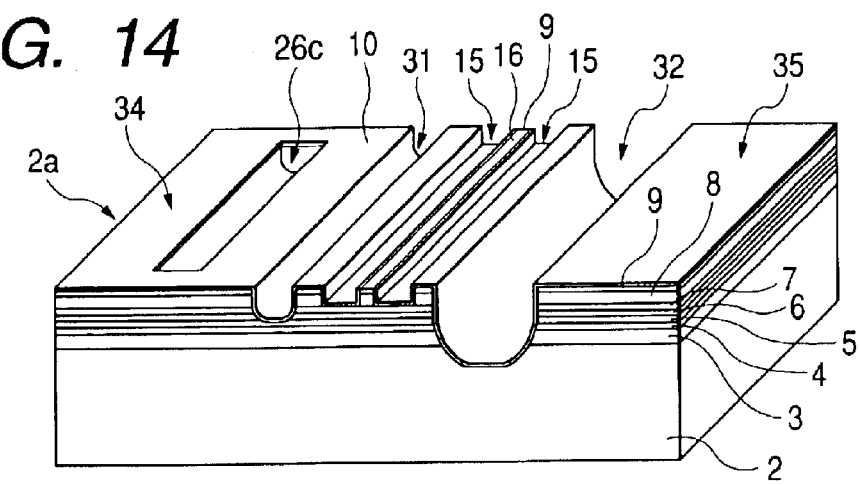
FIG. 14 is a perspective view of the semiconductor substrate in which upon manufacture of the semiconductor laser of the first embodiment, the passivation film is selectively removed to form the contact hole for the electrode, and the top of the ridge is made open.

Next, as shown in FIG. 13, a photoresist film 42 is formed over the main surface of the wafer 2a except for the top of the ridge 16 and the top of the contact hole 26. Etching is performed with the photoresist film 42 as a mask to thereby remove the insulating film 10 located below the mask, thereby opening the top of the ridge and forming the contact hole 26c (S106). FIG. 14 is a diagram from which the photoresist film 42 has been removed.

Figure 15:
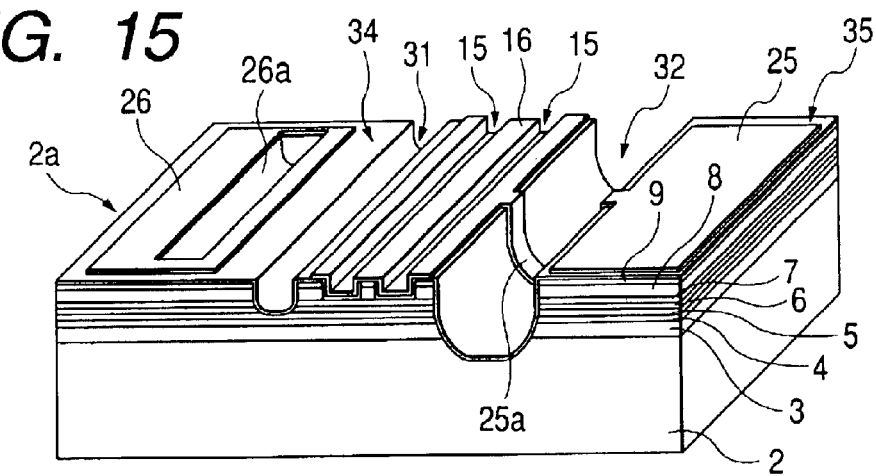
FIG. 15 is a perspective view of the semiconductor substrate formed with a surface electrode and formed with an anode electrode and a cathode electrode on the same surface upon manufacture of the semiconductor laser of the first embodiment.

Next, as shown in FIG. 15, electrodes are selectively formed on the main surface of the wafer 2a (S107). After an electrode layer has been formed over the whole area of the main surface of the wafer 2a by vapor deposition or the like, for example, the electrode layer is formed in predetermined patterns by the normal photolithography technology and etching technology. The electrode layer comprises an anode electrode 25 formed on the right surface of the first isolation trench 31 and a cathode electrode 26 formed on the flat surface 34 located on the left side of the first isolation trench 31. Since the cathode electrode 26 is formed in an area including the contact hole 26c, a contact portion 26a formed in the contact hole 26c is electrically connected to the lower SCH layer 5 located below the active layer 6. The anode electrode 25 comprises a portion connected to the p-InGaAs layer 9 corresponding to the surface of the ridge 16, a portion which extensively extends over the flat surface 35, and a thin electrode portion 25a which crosses the second isolation trench 32 for connecting these.

Next, the back surface of the wafer 2a is polished so as to take a predetermined thickness (S108). Thereafter, a metallized layer 27 is formed on the back surface of the wafer 2a (S109). The whole thickness of the wafer 2a is set to, for example, about 100 $\mu$m by the polishing.

Next, the wafer 2a is sequentially divided by crystal cleavage in a direction perpendicular to the ridge 16 to thereby form individual slender bar or strip bodies each having a width of about 200 $\mu$m (S110). Both side faces of each strip body result in cleavage planes and serve as outgoing surfaces for emitting laser light.

Next, a reflective film is formed on each of the outgoing surfaces (S111). A reflective film whose reflectivity is 1% or less, for example, is formed on a surface which serves as a forward outgoing surface of a semiconductor laser, whereas a reflective film whose reflectivity is 90% or more, is formed on a backward outgoing surface.

Figure 16:
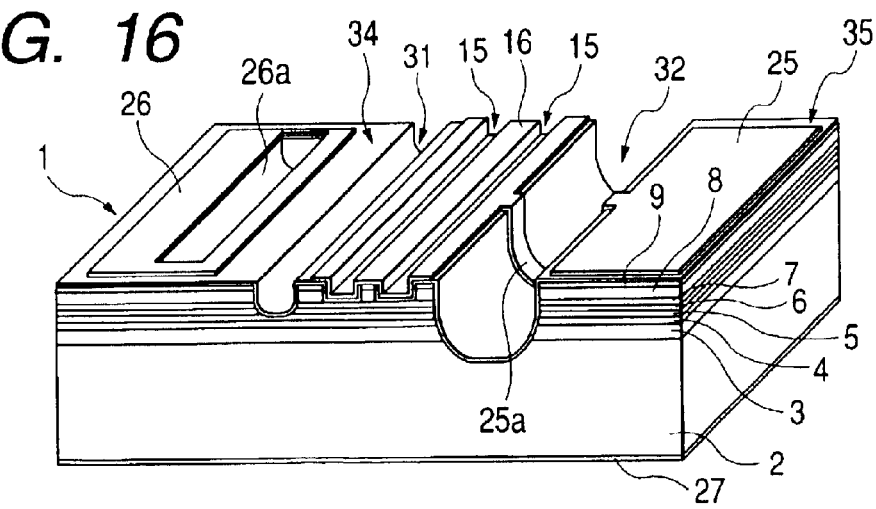
FIG. 16 is a perspective view of the semiconductor laser formed by bringing the semiconductor substrate into fractionization upon manufacture of the semiconductor laser of the first embodiment.

Next, the strip body is divided to fabricate such a semiconductor laser 1 as shown in FIG. 16 in large numbers. In the semiconductor laser 1, the length thereof as viewed in the direction of the ridge 16 becomes about 200 $\mu$m, the width thereof becomes about 400 $\mu$m and the thickness thereof becomes about 100 $\mu$m.

Figure 22:
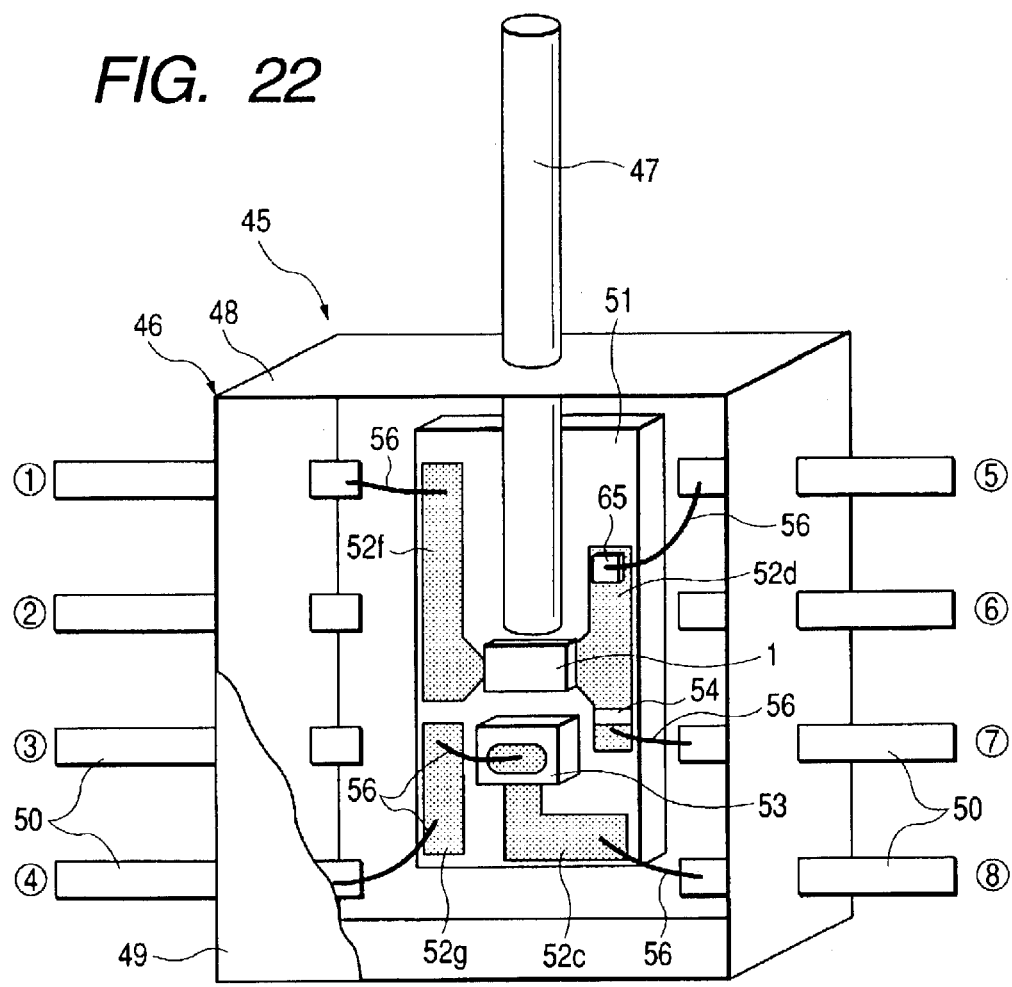
FIG. 22 is a typical perspective view showing part of a semiconductor laser module in which the semiconductor laser of the first embodiment is built in a junction-down state.
Figure 23:
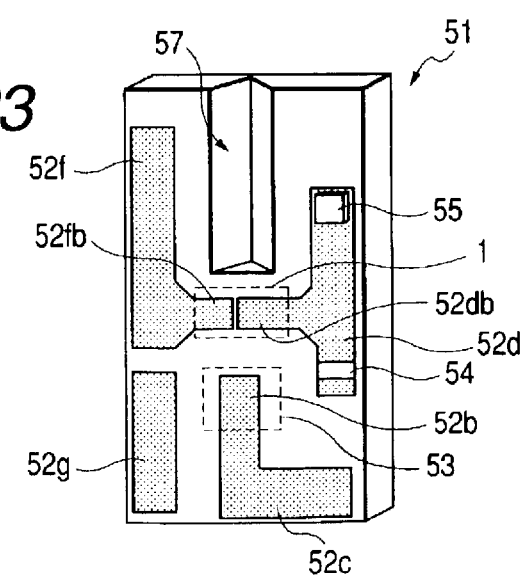
FIG. 23 is a typical perspective view of a carrier equipped with the semiconductor laser and the like built in the semiconductor laser module shown in FIG. 22.
Figure 24:
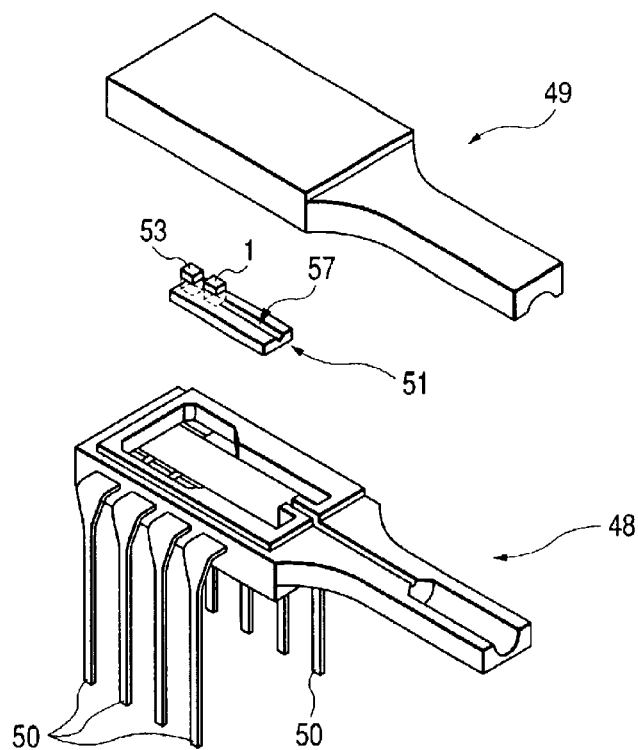
FIG. 24 is a partly exploded perspective view showing a state in which the semiconductor laser of the first embodiment is built in a package in which leads are set in a dual line configuration.

A semiconductor laser module with the semiconductor laser 1 of the first embodiment built therein will next be explained. FIGS. 18 through 21 show an example in which the semiconductor laser 1 is mounted in a junction up state, and FIGS. 22 and 23 show an example in which the semiconductor laser 1 is mounted (flip-chip packaged) in a junction down state. FIG. 24 relates to an example in which the semiconductor laser 1 is mounted in a junction down state to a plastic case wherein each lead shape takes a dual inline structure. Namely, means for connecting electrodes of a semiconductor laser and electrodes connected to external electrode terminals are wire bonding or flip-chip connections.

Figure 18:
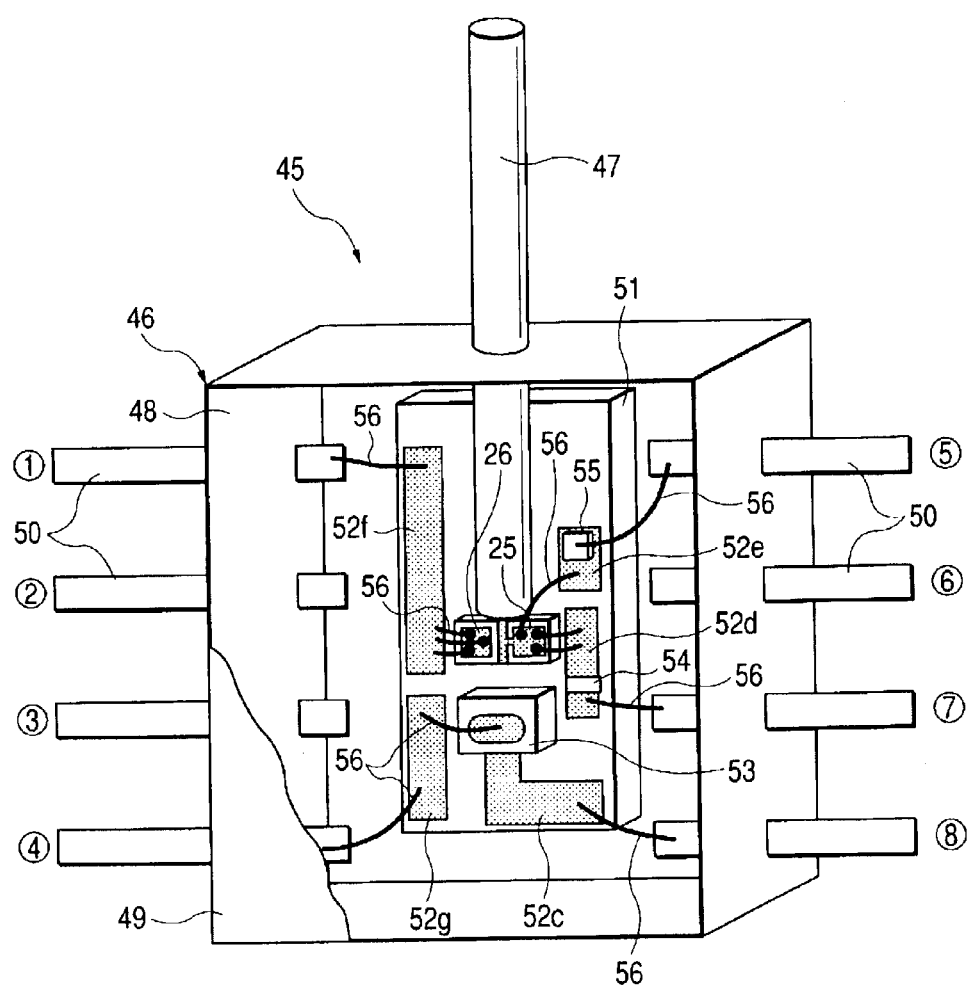
FIG. 18 is a typical perspective view showing part of a semiconductor laser module in which the semiconductor laser of the first embodiment is built in a junction-up state.

As shown in FIG. 18, a semiconductor laser module 45 has a structure wherein an optical fiber 47 is protruded from one end of a box-type package 46. While FIG. 18 is shown as a drawing in which the optical fiber 47 is directly protruded from the package 46, the optical fiber actually takes such a structure that the surface thereof is protected by a fiber cable and the fiber cable protrudes from a package. The package is made up of a ceramic package or a plastic package. Each of these packages comprises a package body and a cap for blocking the package body. The optical fiber 47 comprises a core and a clad for covering the core.

The package 46 shown in FIG. 18 comprises a box type package body 48, and a cap 49 for blocking the package body 48. Leads (external electrode terminals) 50, which extend inside and outside the package body 48, are disposed side by side in plural form on both sides of the package body 48. In FIG. 18, the leads 50 extends straight and are provided in the form of a butterfly type. The four leads 50 respectively protrude from both sides of the package body 48. In the drawing, reference numerals indicated by ① through ⑧ are applied to the leads 50 respectively for convenience of explanation.

Figure 19:
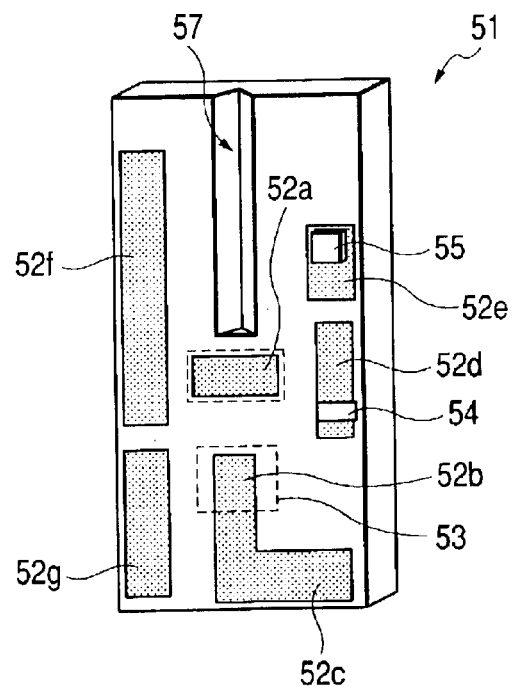
FIG. 19 is a typical perspective view of a carrier equipped with a semiconductor laser and the like built in the semiconductor laser module.

A support substrate 51 is fixed to the bottom of the package body 48. The support substrate 51 is formed of a silicon plate. A metallized layer 52 is formed on an upper surface (main surface) thereof in a predetermined pattern as shown in FIG. 19. The metallized layer 52 has an LD mounting portion 52a on which the semiconductor laser 1 is mounted, a wiring 52c having a PD mounting portion 52b equipped with a light-receiving element 53 for monitoring backward laser light emitted from the semiconductor laser 1, a wiring 52d having part to which a resistor 54 is fixed, a wiring 52e having part to which a coil 55 is fixed, a wiring 52f to which the other end of a wire 56 whose one end is connected to its corresponding electrode of the semiconductor laser 1, is connected, and a wiring 52g to which the other end of the wire 56 whose one end is connected to its corresponding electrode of the light-receiving element 53, is connected. A guide groove or trench 57 for guiding the optical fiber 47, which has a cross section shaped in the form of a V-shaped trench, is provided for the support substrate 51.

Figure 20:
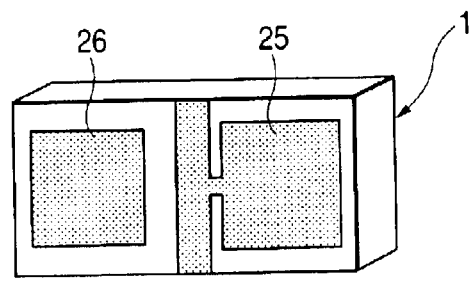
FIG. 20 is a typical perspective view of the semiconductor laser mounted in the carrier.

As shown in FIG. 18, the support substrate 51 is fixed to the inner bottom of the package body 48. The semiconductor laser 1 shown in FIG. 20 is fixed to the LD mounting portion 52a, and the light-receiving element 53 is fixed to the PD mounting portion 52b. The resistor 54 is fixed to the wiring 52d through one electrode, and the coil 55 is fixed to the wiring 52e through one electrode. An inner end portion of the optical fiber 47 is guided by the guide trench 57 and fixed by an unillustrated bonding material. An inner end surface of the optical fiber 47 is provided face to face with a forward outgoing surface of the semiconductor laser 1 to thereby take laser light in the core.

As shown in FIG. 18, predetermined electrodes of the semiconductor laser 1 and the light-receiving element 53, and predetermined wiring portions are electrically connected to one another by their corresponding conductive wires 56. Namely, the anode electrode 25 of the semiconductor laser 1, the wiring 52d and the wiring 52e are connected to one another by their corresponding wires 56, and the cathode electrode 26 of the semiconductor laser 1 and the wiring 52f are connected to one another by the corresponding wire 56.

The lead 50 indicated by ① is connected to the wiring 52f through its corresponding wire 56 at its inner end, the lead 50 indicated by ④ is connected to the wiring 52g through its corresponding wire 56 at its inner end, the lead 50 indicated by ⑤ is connected to an upper electrode of the coil 55 through its corresponding wire 56 at its inner end, the lead 50 indicated by ⑦ is connected to the wiring 52d through its corresponding wire 56 at its inner end, and the lead 50 indicated by ⑧ is connected to the wring 52c through its corresponding wire 56 at its inner end, respectively.

Figure 21:
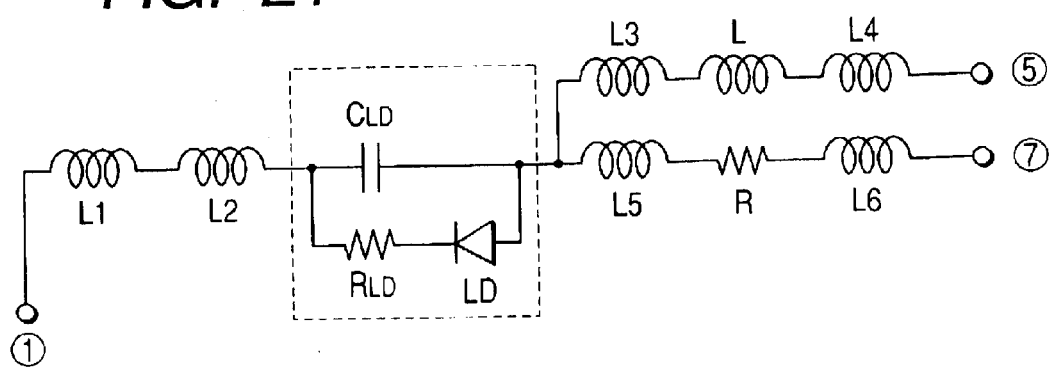
FIG. 21 is an equivalent circuit diagram of a laser drive unit of the semiconductor laser module.

FIG. 21 is an equivalent circuit of a laser drive unit. In the equivalent circuit, L1 indicates the inductance of the wire 56 for connecting the lead ① and the wiring 52f, L2 indicates the inductance of the wire 56 for connecting the wiring 52f and the cathode electrode 26 of the semiconductor laser 1, L3 indicates the inductance of the wire 56 for connecting the anode electrode 25 of the semiconductor laser 1 and the wiring 52e, L indicates the inductance of the coil 55, L4 indicates the inductance of the wire 56 for connecting an electrode of the coil 55 and the lead ⑤, L5 indicates the inductance of the wire 56 for connecting the anode electrode 25 of the semiconductor laser 1 and the wiring 52d, R indicates the resistance of the resistor 54, and L6 indicates the inductance of the wire 56 for connecting the wire 52d and the lead ⑦, respectively. CLD indicates the capacity of the semiconductor laser 1, RLD indicates a resistor of the semiconductor laser 1, the lead ① indicates a ground terminal (GND), the lead ⑤ indicates a bias current input terminal, and the lead ⑦ indicates a signal current input terminal, respectively.

FIG. 22 shows an example in which the semiconductor laser 1 is mounted in the package 46 in a junction down state, i.e., an example of flip-chip packaging. Since the LD mounting portion 52a on the support substrate 51 shown in FIG. 19 becomes unnecessary and the semiconductor laser 1 is mounted in this state in the present example, an LD electrode fixing portion 52fb and an LD electrode fixing portion 52db are provided as such patterns that they respectively protrude in a cantilever form from a wiring 52f and a wiring 52d. Since the semiconductor laser 1 is turned upside down and fixed, one electrode of the semiconductor laser 1 is fixed to the LD electrode fixing portion 52db, and the other electrode of the semiconductor laser 1 is fixed to the LD electrode fixing portion 52fb. Upon the fixing referred to above, a bonding material such as PbSn solder or the like is used.

In the present example as well, the wiring 52d extends to the wiring 52e shown in FIG. 19 and the coil 55 also takes such a structure that it is fixed to the wiring 52d. In the present example, the number of wire-used points can be considerably reduced, the assembly of the module becomes easy, and the inductance of each wire is reduced.

FIG. 24 is a partly-omitted exploded perspective view. FIG. 24 shows a dual inline structure wherein leads 50, which protrude from both sides of a package body 48 made up of plastic, are turned downward at their protruding base portions. Even in this case, a support substrate 51 having a guide groove or trench 57 is fixed to the inner bottom of the package body 48. The semiconductor laser 1 is flip-chip packaged to the support substrate 51 in a junction down state. A cap 49 has such a structure as to block the package body 48.

Figure 17A:
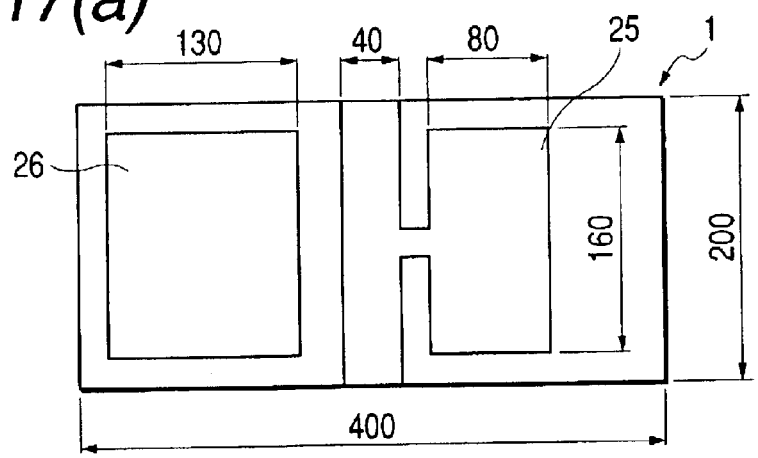
FIGS. 17(a) to (c) are typical diagrams showing dimensional examples of electrodes of the semiconductor laser of the first embodiment and a semiconductor laser discussed in advance of the present invention.
Figure 17B:
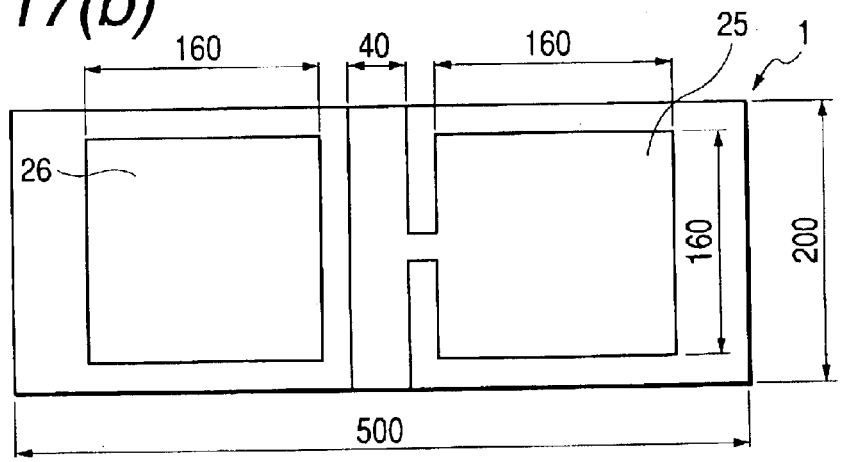
Figure 17C:
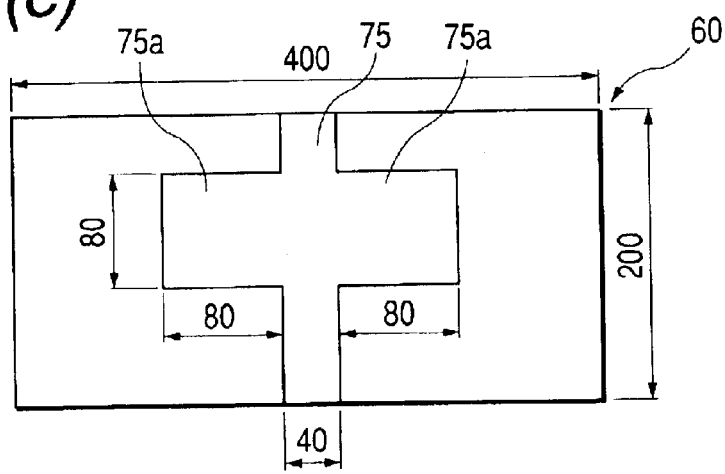
Figure 31:
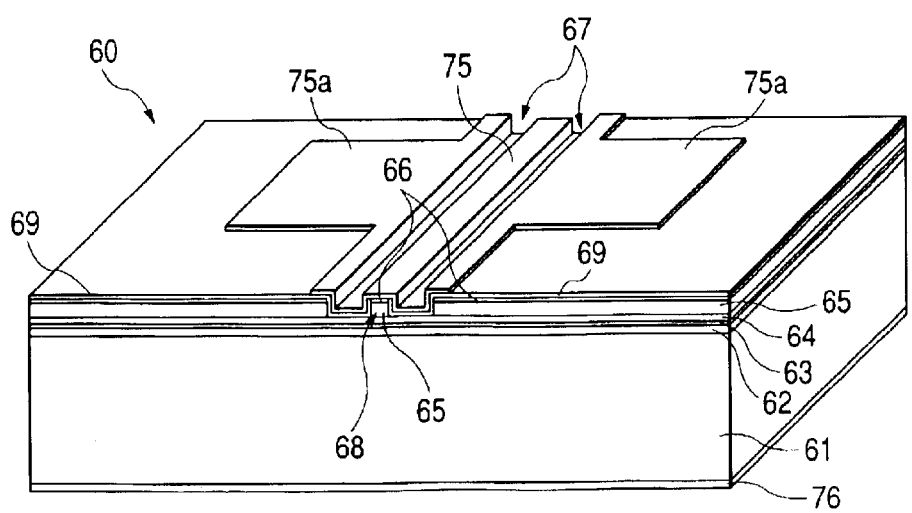
FIG. 31 is a typical perspective view of a semiconductor laser discussed prior to the present invention.
Figure 32:
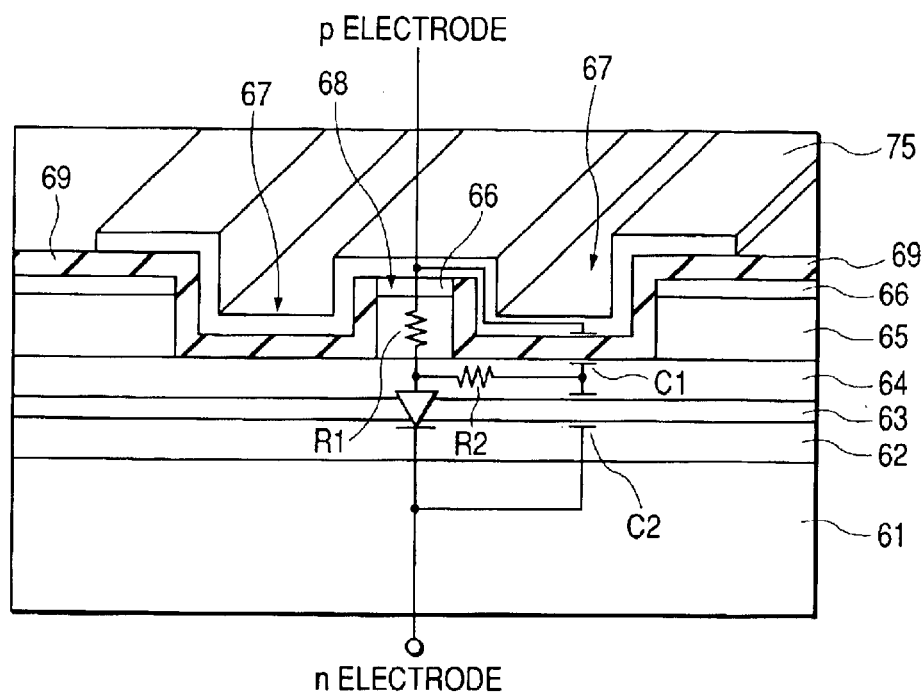
FIG. 32 is an enlarged cross-sectional view of part including a ridge of the semiconductor laser discussed in advance of the present invention.
Figure 33A:
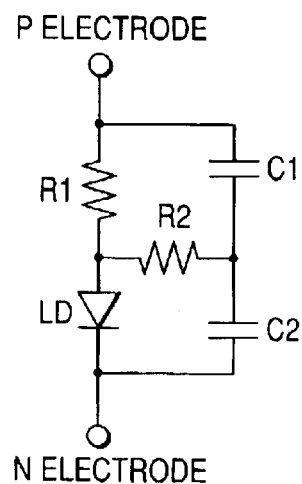
FIG. 33 is an equivalent circuit diagram of the semiconductor laser discussed prior to the present invention.
Figure 33B:
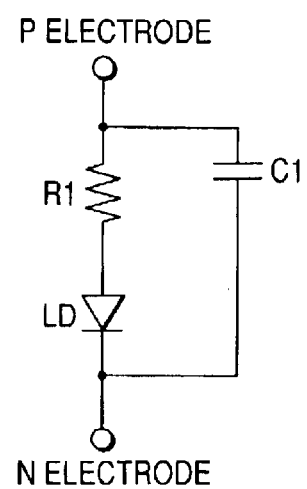

FIGS. 17(a) to 17(c) show dimensional examples of electrodes of the semiconductor laser 1 according to the first embodiment and a semiconductor laser 60 shown in FIG. 31. These electrodes are used as wire bonding portions for connecting wires when the semiconductor laser is mounted in a junction up state. The electrodes are used as joining or bonding portions each connected by a bonding material when the semiconductor laser is mounted in a junction down state. FIG. 17(c) is a dimensional example of the electrode of the semiconductor laser 60 shown in FIG. 31.

Figure 25:
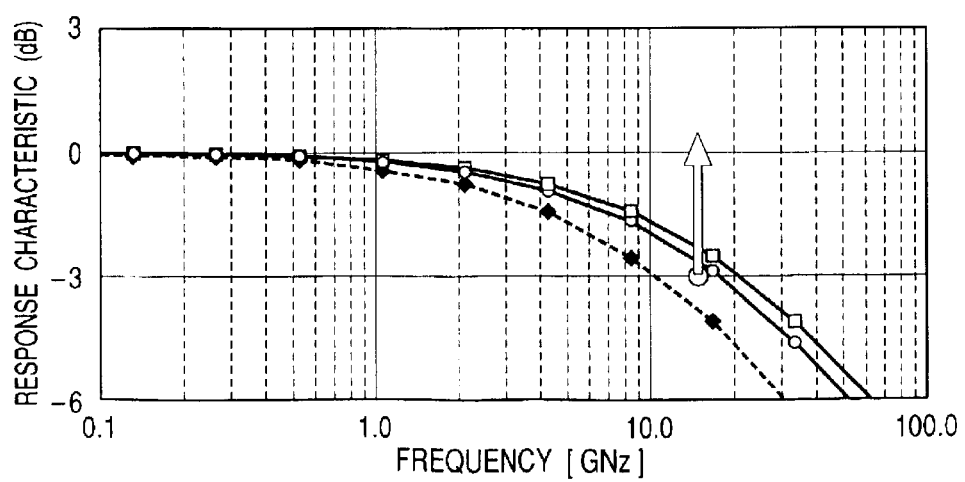
FIG. 25 is a graph showing a calculation example of frequency-response characteristics obtained in the semiconductor laser module of the first embodiment.

An example in which an electrode pattern is designed in such a low-capacity structure that the area of a p electrode (anode electrode 25) is substantially identical to it, is shown in FIG. 17(a) with respect to the dimensional example of FIG. 17(c). An example in which an electrode pattern is designed so that the area of a p electrode reaches about twice that thereof, is shown in FIG. 17(b) with respect to the dimensional example of FIG. 17(c). An example in which electrical responses at the time that the resistance of a semiconductor laser is 8 Ω and the thickness of an insulating film 10 formed of an $SiO_2$ film is 500 nm, is calculated in the semiconductor laser module 45 having such a structure, is shown in FIG. 25. For the purpose of transmission of 10 Gbps, the electrical response may preferably be −3 dB or more at 15 GHz. It is understood that in the low-capacity structure of the first embodiment, −3 dB or more is obtained at 15 GHz even if the area of the p electrode is set to twice that of the structure of the semiconductor laser 60.

According to the first embodiment, the following advantageous effects are brought about.

(1) Since the semiconductor laser 1 is set as a structure wherein the ridge is formed on the multilayered semiconductor layer provided on the main surface side of the semiconductor substrate 2, the first and second isolation trenches for dividing the active layer 6 corresponding to the middle layer of the multilayered semiconductor layer both partition the narrow area including the ridge, the p electrode and n electrode are provided on the main surface side of the semiconductor laser 1, and the overlapping areas of the semiconductors connected to both electrodes do not depend on electrode sizes, capacity do not depend on an electrode area either. Since the length of the isolation trench-to-isolation trench area 33 including the ridge between the first isolation trench and the second isolation trench is narrowed down to 30 μm to 40 μm, a reduction in capacity can be achieved. Accordingly, the semiconductor laser module 45 with the semiconductor laser 1 built therein is capable of performing high-speed modulation owing to the reduction in capacity and thereby achieving high-speed communications when used in optical communications.

(2) Since the sizes of the p electrode and the n electrode can be determined without increasing the capacity, the p and n electrodes each having a predetermined area can be formed. Thus, when the semiconductor laser 1 is mounted in a junction up state, the areas for bonding of the p and n electrodes connected with their corresponding wires can be sufficiently ensured, and the reliability of wire bonding can be enhanced. Accordingly, the reliability of the semiconductor laser module 45 can be achieved. Since the bonding areas of the p and n electrodes can be sufficiently taken even when the semiconductor laser 1 is mounted in a junction down state, the reliability of chip bonding and the reliability of electrical connections are enhanced. Accordingly, the semiconductor laser module 45 can achieve reliability enhancement.

(3) Since such a structure that the p and n electrodes are disposed on the main surface side of the semiconductor laser 1 is taken, the flip-chip packaging is made possible in the junction down state, and the mounting of the semiconductor laser 1 and the connection of the electrodes can be simultaneously performed. Accordingly, it is possible to reduce the cost of assembly of a semiconductor device such as the semiconductor laser module 45 with the semiconductor laser 1 built therein.

(Second Embodiment)

Figure 26:
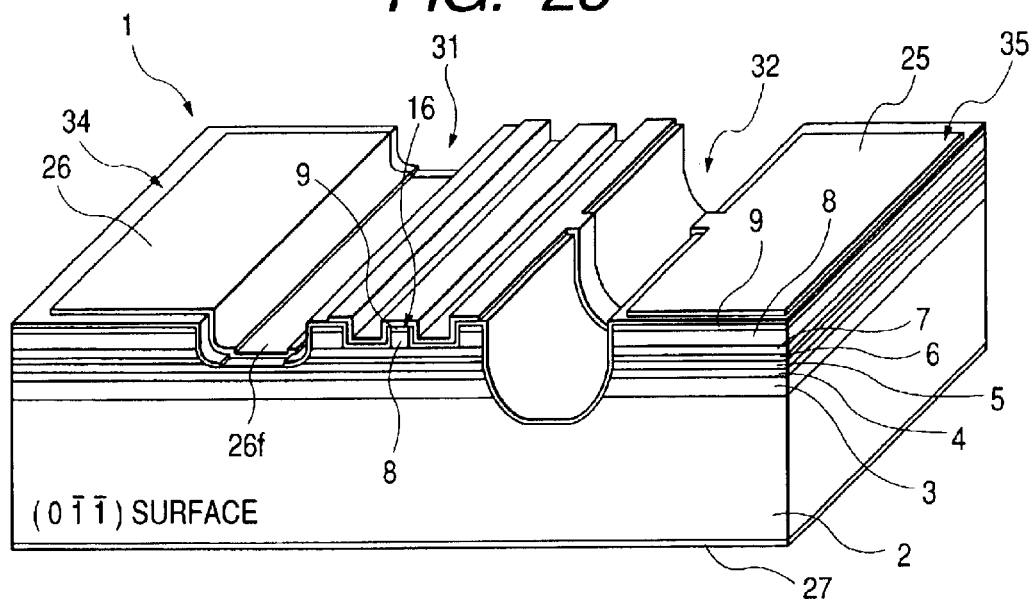
FIG. 26 is a typical perspective view of a semiconductor laser showing another embodiment (second embodiment) of the present invention.
Figure 27:
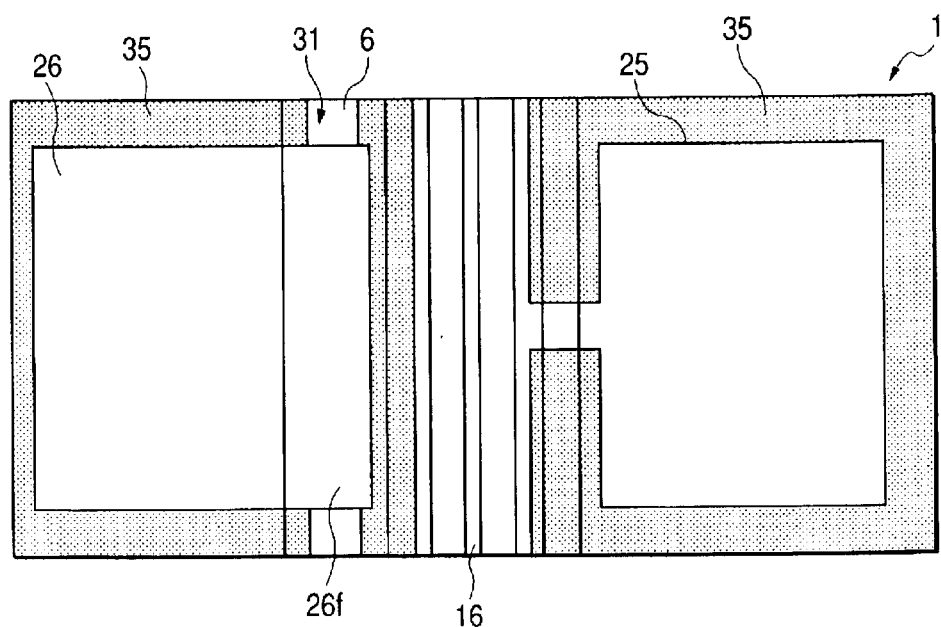
FIG. 27 is a typical plan view illustrating the relationship of position between isolation trenches and an electrode employed in the second semiconductor laser of the second embodiment.

FIG. 26 is a typical perspective view of a semiconductor laser showing another embodiment (second embodiment) of the present invention, and FIG. 27 is a typical plan view showing the relationship of position between isolation trenches and electrodes of the semiconductor laser, respectively.

The semiconductor laser 1 according to the second embodiment is one wherein in the semiconductor laser 1 of the first embodiment, a cathode electrode 26 is electrically connected to a lower SCH layer 5 below the bottom of a first isolation trench 31 without through a contact hole. While the first embodiment has such a structure that the surface of the first isolation trench 31 is covered with the insulating film 10, no insulating film 10 is provided at the bottom of the first isolation trench 31 in the second embodiment. The cathode electrode 26 formed on a flat surface 34 on the left side of the first isolation trench 31 with the insulating film 10 interposed therebetween is caused to extend to the first isolation trench 31. A tip portion of such an extension 26f is formed as such a structure as to electrically contact the lower SCH layer 5 exposed at the bottom of the first isolation trench 31.

In the second embodiment, the formation of the contact hole for connecting part of the cathode electrode 26 to the lower SCH layer 5 becomes unnecessary and the manufacturing cost of the semiconductor laser 1 can be reduced.

(Third Embodiment)

Figure 28:
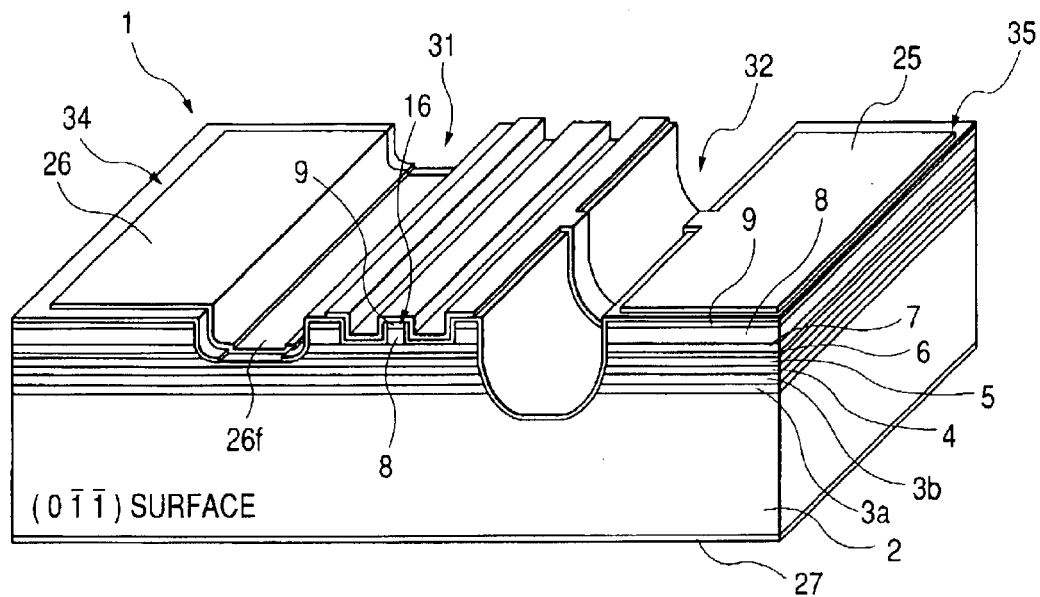
FIG. 28 is a typical perspective view of a semiconductor laser showing a further embodiment (third embodiment) of the present invention.

FIG. 28 is a typical perspective view of a semiconductor laser showing a further embodiment (third embodiment) of the present invention.

The semiconductor laser 1 of the third embodiment is an improved one of the second embodiment. The third embodiment has a structure wherein in a multilayered semiconductor layer provided on a main surface of a semiconductor substrate 2, a p-InP layer 3a and an n-InP layer 3b are formed on the semiconductor substrate (n-InP substrate) 2 to form a pn junction, and an n-InP layer 4, a lower SCH layer 5, an active layer 6, an upper SCH layer 7, a p-InP layer 8, and a p-InGaAs layer 9 are sequentially formed over the n-InP layer 3b in a manner similar to the second embodiment. Since the pn junction whose current flow is opposite to the flow of a current of a semiconductor laser based on the p-InP layer 3a and the n-InP layer 3b as an alternative to the Fe—InP layer 3 employed in the second embodiment, the multilayered semiconductor layer including the lower SCH layer 5, the active layer 6 and the upper SCH layer 7 can be electrically isolated from the semiconductor substrate (n-InP substrate) 2 upon operation of the semiconductor laser 1 in a manner similar to the Fe—InP layer 3.

The third embodiment has a feature that an Fe doping step becomes unnecessary. This is suitable for the manufacture of a semiconductor laser that takes against the mixing of Fe.

(Fourth Embodiment)

Figure 29:
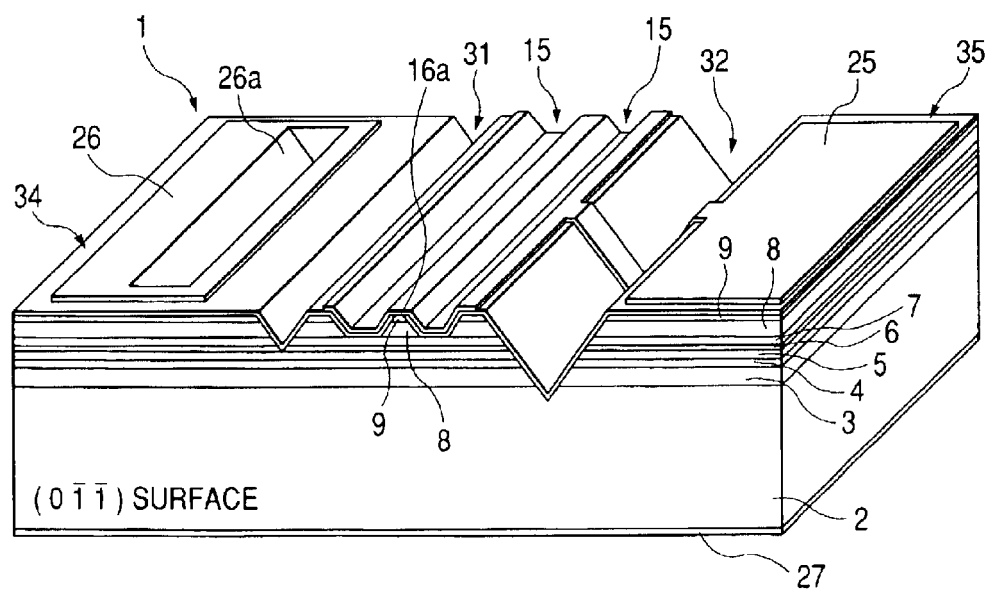
FIG. 29 is a typical perspective view of a semiconductor laser illustrating a still further embodiment (fourth embodiment) of the present invention.

FIG. 29 is a typical perspective view of a semiconductor laser showing a still further embodiment (fourth embodiment) of the present invention.

In the semiconductor laser 1 showing the fourth embodiment, the first isolation trench 31 and the second isolation trench 32 in the semiconductor laser 1 according to the first embodiment have cross sections each shaped in the form of a V-shaped trench structure. When a crystal plane on an outgoing surface of the semiconductor laser 1 on the frontward side thereof is represented as (0, bar 1, bar 1), a mesa portion is formed when wet etching is effected thereon, and each trench results in a V-shaped cross section. The depth of each trench depends on an open width of a mask at etching. When it is wide, the depth thereof becomes deep, whereas when it is shallow or narrow, the depth thereof becomes shallow. Accordingly, the first isolation trench 31 and the second isolation trench 32 can be simultaneously formed owing to the formation of the etching masks different in open width in the fourth embodiment, and the manufacturing cost of the semiconductor laser 1 can be reduced owing to a reduction in the number of steps. Incidentally, a stripe-shaped mesa portion 16a similar to the ridge (stripe) 16 is formed between the two trenches 15. The mesa portion 16a comprises a p-InP layer 8 and a p-InGaAs layer 9.

(Fifth Embodiment)

Figure 30:
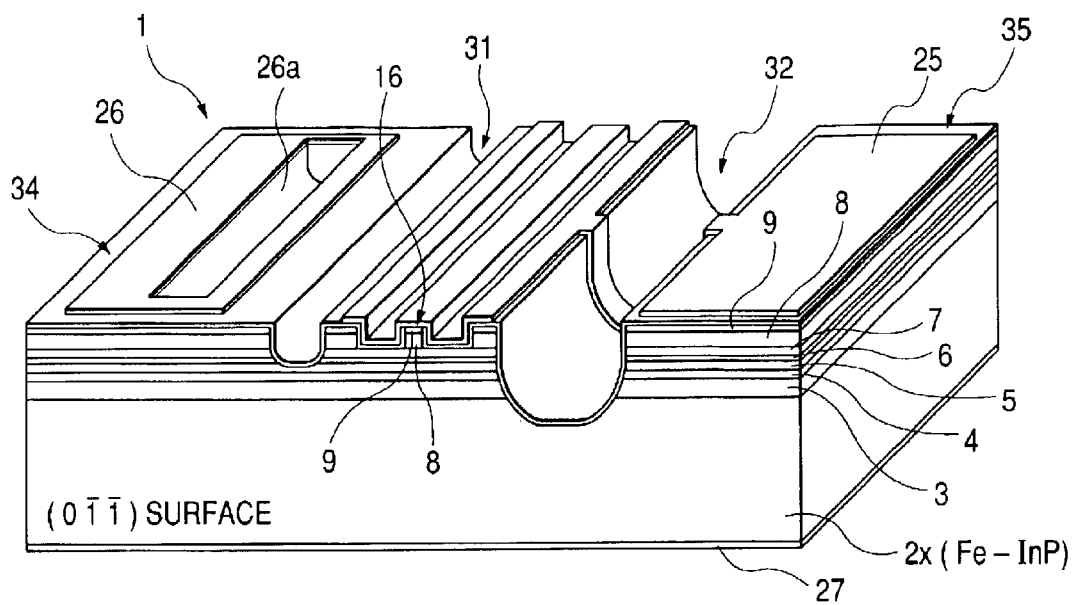
FIG. 30 is a typical perspective view of a semiconductor laser depicting a still further embodiment (fifth embodiment) of the present invention.

FIG. 30 is a typical perspective view of a semiconductor laser showing a still further embodiment (fifth embodiment) of the present invention.

The semiconductor laser 1 showing the fifth embodiment is one wherein in the semiconductor laser 1 showing the first embodiment, the semiconductor substrate is provided as an insulating Fe—InP substrate (semiconductor substrate) 2x including Fe. The Fe—InP layer 3 employed in the first embodiment becomes unnecessary in the third embodiment. A manufacturing process is thus simplified and hence a reduction in manufacturing cost can be achieved.

While the invention made above by the present inventors has been described specifically based on the illustrated embodiments, the present invention is not limited to the embodiments. It is needless to say that various changes can be made thereto within the scope not departing from the substance thereof.

Advantageous effects obtained by typical ones of the inventions disclosed in the present application will be described in brief as follows:

(1) A low-capacity semiconductor laser can be provided.

(2) A low-capacity semiconductor laser can be provided which has an anode electrode and a cathode electrode on the same surface side.

(3) A low-capacity semiconductor laser can be provided which has an anode electrode and a cathode electrode on the same surface side and is large in electrode area.

(4) A semiconductor laser module can be provided which is capable of performing high-speed modulation at low capacity.

(5) A semiconductor laser module can be provided which is high in the reliability of packaging and wire bonding of a semiconductor laser and which is capable of performing high-speed modulation at low capacity.

What is claimed is:

1. A semiconductor laser, comprising:
   a light-emitting unit, an anode area and a cathode area formed over a semiconductor substrate;
   a high-resistance layer formed over the semiconductor substrate;
   a first semiconductor layer of first conductivity type formed over the high-resistance layer;
   an active layer formed over the first semiconductor layer;
   a second semiconductor layer of second conductivity type corresponding to conductivity type opposite to the first conductivity type, the second semiconductor layer being formed over the active layer;
   a first isolation trench which divides the second semiconductor layer and the active layer between the light-emitting unit and a cathode area;
   a bottom of said first isolation trench is between the second conductivity type semiconductor layer bottom and the first conductivity type semiconductor layer bottom;
      a second isolation trench which divides the first and second semiconductor layers and the active layer between the light-emitting unit and an anode area;
   a bottom of said second isolation trench is under the first conductivity type semiconductor layer;
      an insulating film having an opening, which is formed over the second semiconductor layer;
   a first electrode formed over the insulating film in the light-emitting unit and electrically connected to the second semiconductor layer;
   a second electrode formed over the insulating film in the cathode area and electrically connected to the first semiconductor layer; and
   a third electrode formed over the insulating film in the anode area and electrically connected to the first electrode.

2. The semiconductor laser according to claim 1, wherein a third semiconductor layer of the second conductivity type is formed between the second semiconductor layer and the first electrode in the light-emitting unit,
   the second semiconductor layer and the first electrode are electrically connected via the opening of the insulating film, and
   the first electrode and the third semiconductor layer respectively have a ridge structure.

3. The semiconductor laser according to claim 1, wherein the active layer has a multiple quantum well structure.

4. The semiconductor laser according to claim 3, wherein the active layer comprises an InGaAlAs layer.

5. The semiconductor laser according to claim 1, wherein the second and third electrodes are formed over the same surface side of the semiconductor substrate.

6. The semiconductor laser according to claim 1, wherein a fourth semiconductor layer of the first conductivity type is formed below the active layer, and a fifth semiconductor layer of the second conductivity type is formed above the active layer.

7. The semiconductor laser according to claim 6, wherein the fourth semiconductor layer and the fifth semiconductor layer are respectively comprised of an n-type InGaAlAs layer and a p-type InGaAlAs layer.

8. The semiconductor laser according to claim 6, wherein a contact hole is formed in the cathode area, and the second electrode and the fourth semiconductor layer are electrically connected to each other through the contact hole.

9. The semiconductor laser according to claim 1, wherein the first and second semiconductor layers are respectively comprised of an n-type InP and a p-type InP.

10. The semiconductor laser according to claim 1, wherein the high-resistance layer is formed by proton implantation or being doped with Fe.

11. The semiconductor laser according to claim 10, wherein the high-resistance layer comprises InP doped with Fe.

12. The semiconductor laser according to claim 1, wherein cross-sections of the first and second isolation trenches as viewed in surfaces thereof perpendicular to the direction in which the first and second isolation trenches extend, have V shapes respectively.

13. The semiconductor laser according to claim 1, wherein cross-sections of the first and second isolation trenches as viewed in surfaces thereof perpendicular to the direction in which the first and second isolation trenches extend, have U shapes respectively.

14. The semiconductor laser according to claim 1, wherein wires are bonded to the second and third electrodes respectively.

15. The semiconductor laser according to claim 1, wherein the high-resistance layer comprises a laminated layer of a plurality of sixth and seventh semiconductor layers respectively having the first and second conductivity types.

16. The semiconductor laser according to claim 14, wherein the sixth and seventh semiconductor layers respectively comprise an n-type InP and a p-type InP.

17. The semiconductor laser according to claim 1, wherein a metallized layer for fixing a semiconductor light-emitting element is provided over the back surface of the semiconductor substrate.

* * * * *